United States Patent [19]
Bertin et al.

[11] Patent Number: 6,141,245
[45] Date of Patent: Oct. 31, 2000

[54] IMPEDANCE CONTROL USING FUSES

[75] Inventors: Claude Louis Bertin, South Burlington; John A. Fifield, Underhill; Erik Leigh Hedberg; Russell J. Houghton, both of Essex Junction; Timothy Dooling Sullivan, Underhill; Steven William Tomashot, Williston; William Robert Tonti, Essex Junction, all of Vt.

[73] Assignee: International Business Machines Corporation, Armonk, N.Y.

[21] Appl. No.: 09/302,902

[22] Filed: Apr. 30, 1999

[51] Int. Cl.[7] .................................................. G11C 16/04
[52] U.S. Cl. .................................. 365/185.05; 365/225.7
[58] Field of Search ........................... 365/189.05, 225.7; 326/56, 57, 58

[56] References Cited

U.S. PATENT DOCUMENTS

| | | | |
|---|---|---|---|
| 4,532,607 | 7/1985 | Uchida | 365/96 |
| 5,172,337 | 12/1992 | Iwase et al. | 365/96 |
| 5,536,968 | 7/1996 | Crafts et al. | 257/529 |
| 5,659,182 | 8/1997 | Cohen | 257/50 |
| 5,986,953 | 11/1999 | Kim et al. | 365/189.05 |
| 6,031,767 | 2/2000 | Schuh et al. | 365/189.05 |

*Primary Examiner*—Vu A. Le
*Attorney, Agent, or Firm*—Scully, Scott, Murphy & Presser; Howard J. Walker, Jr., esq.

[57] ABSTRACT

A system and method for reducing impedance loading of semiconductor integrated circuit devices implementing protective device structures that contributes to impedance loading at an I/O pad connection. The method comprises providing a fuse device between the I/O pad connection and the protective device; connecting a current source device associated with each fuse device in the integrated circuit, the current source device connected to one end of the fuse device; providing fuse selection circuit for activating current flow through a selected fuse device between the current source and the I/O connection, the current flow being of an amount sufficient for blowing the fuse and disconnecting the protective device from the circuit structure, thereby reducing impedance loading at the I/O connection. Such a system and method is employed in a memory system comprising integrated circuit chips disposed in a stacked relation, with each chip including: a layer of active circuitry formed at a first layer of each chip; a plurality of through conducting structures disposed substantially vertically through each chip for enabling electronic connection with active circuitry at the first layer; second conducting device disposed at an end of the through conducting structure at an opposite side of a chip for connection with a corresponding through conductive structure of an adjacent stacked chip, the stacked chip structure formed by aligning one or more through conducting structures and second conducting devices of adjacent chips, whereby a chip of the stack is electronically connected to active circuitry formed on other chips of the stack. The stacked chip structure is ideal for reducing data access latency in memory systems employing memory chips such as DRAM.

31 Claims, 26 Drawing Sheets

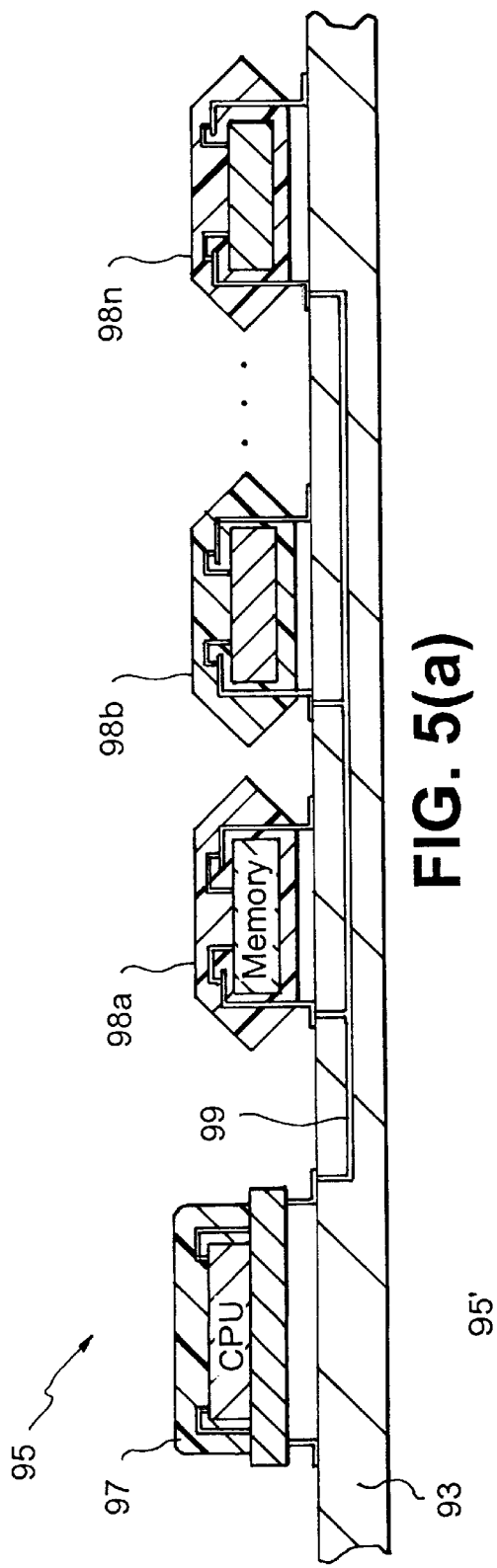
FIG. 5(a)
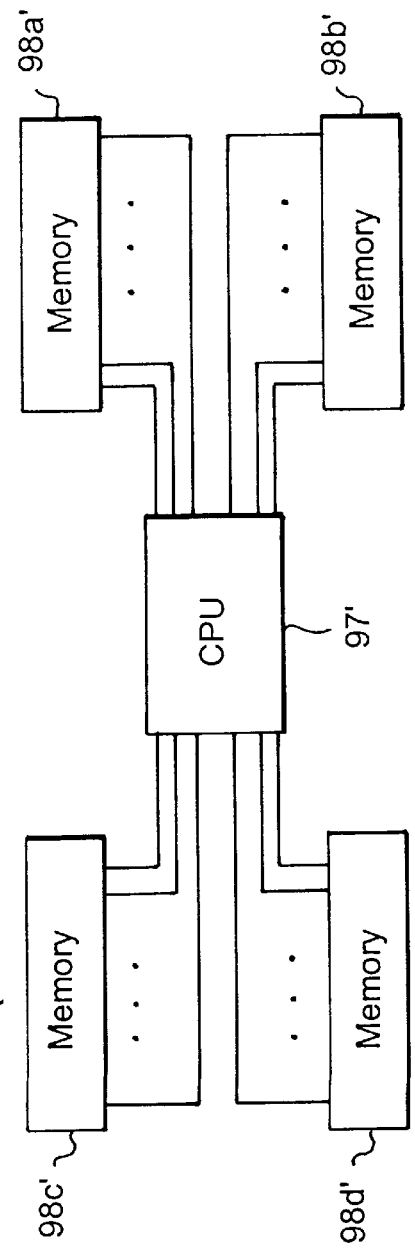
FIG. 5(a)(1)

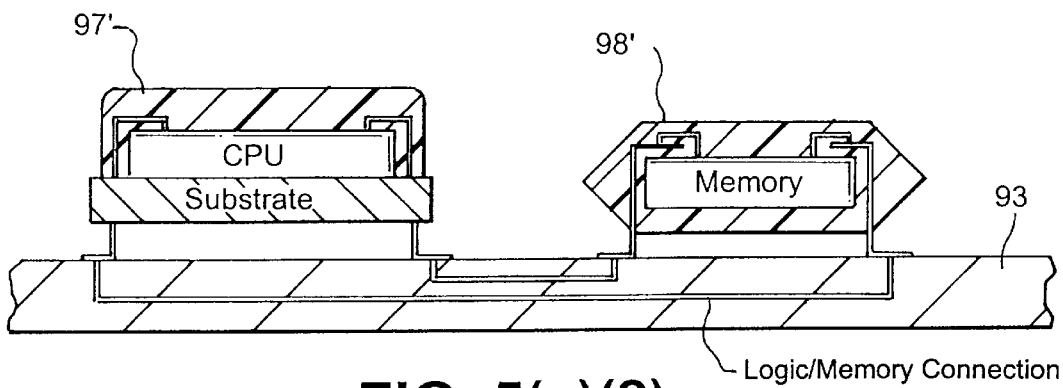
FIG. 5(a)(2)
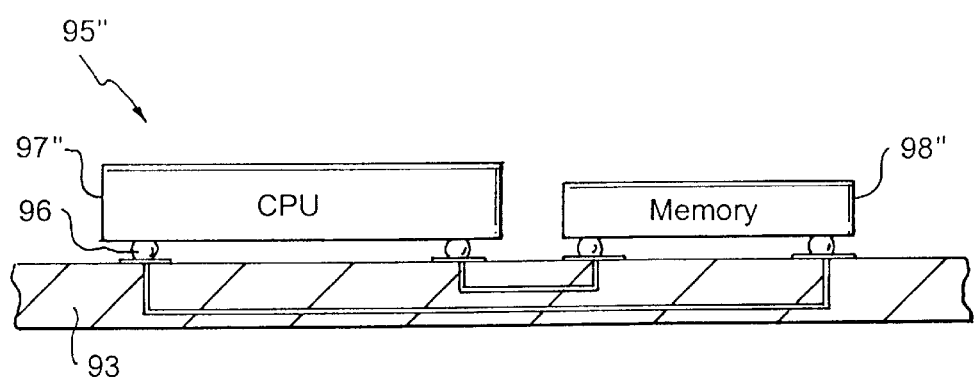
FIG. 5(b)

FIG. 6(a)(1)
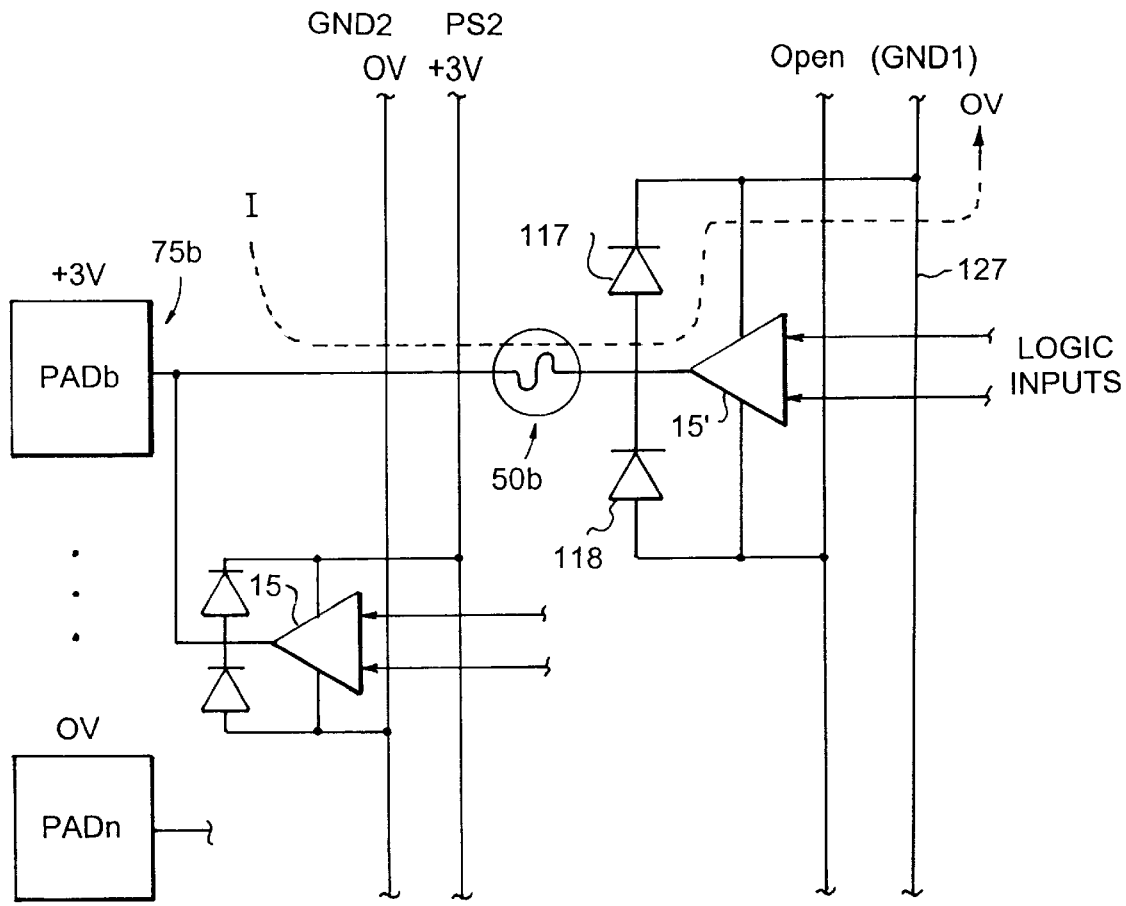
FIG. 6(a)(2)
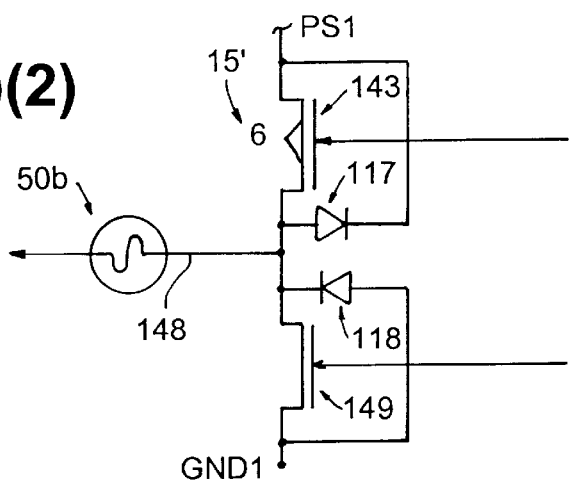

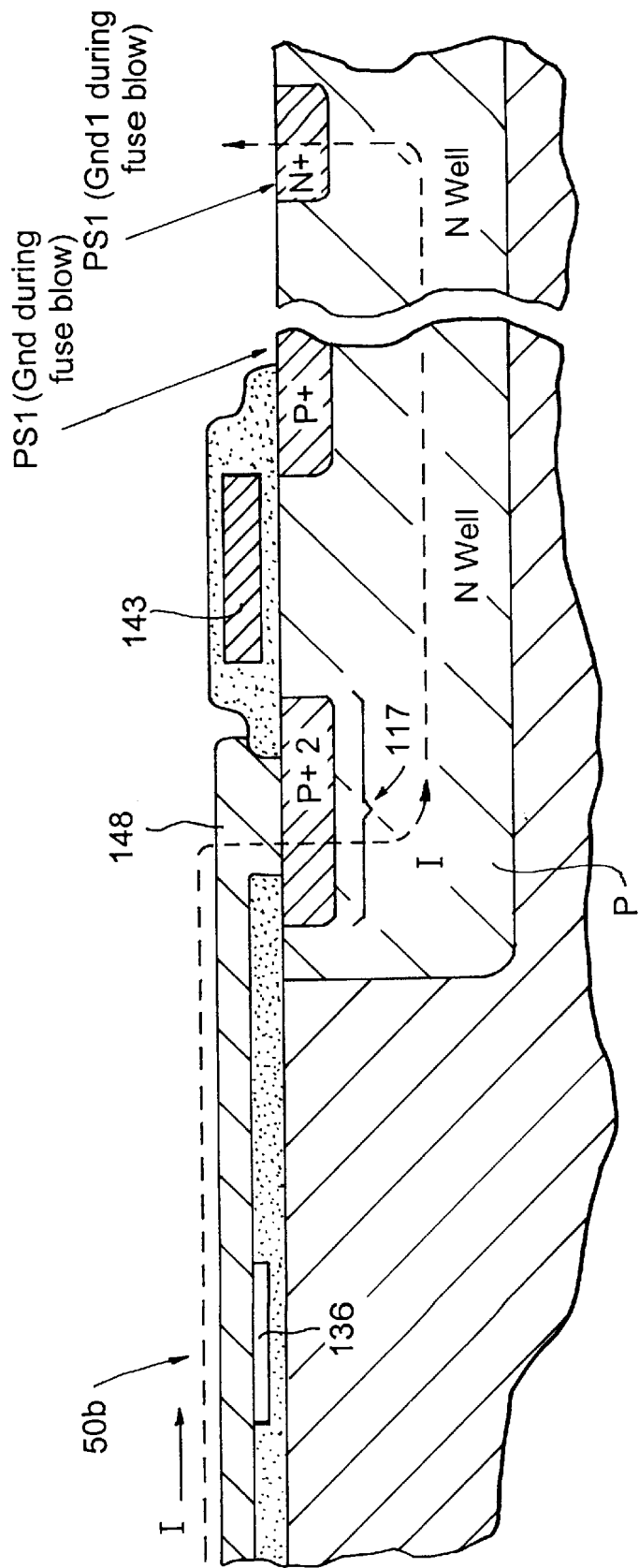
FIG. 6(a)(3)

IMPEDANCE CONTROL USING FUSES

BACKGROUND OF THE INVENTION

1. Field of the Invention

The present invention relates to computer systems and memory system architectures, and specifically, to a method and apparatus for controlling device impedance loading in semiconductor circuits and device structures by implementing and selectively destructing novel fuse devices in the semiconductor chips.

2. Discussion of the Prior Art

Processor performance is increasingly gated by memory performance. Cache hierarchies are used to accommodate fast processors and fast memories. However, as processor speeds dramatically increase, provision of cache memories becomes increasingly insufficient, primarily due to input capacitance loading which is a major limiting factor. For example, memory chip devices are provisioned with protective devices which are used to protect the device from electrostatic discharge, for example, during device manufacture and handling. These protective devices can increase input capacitance by as much as 25%. For example, in a memory device having a common input/output terminal, a combined receiver and output driver may have a capacitance of 24 pf, with the protective device adding an additional 6 pf.

Furthermore, to enhance latency, it is necessary to reduce delay time, deleterious transmission line effects ('ringing'), loading, etc. Not only is the reduction of chip and package parasitic capacitance and inductance necessary for high performance operation, but the physical proximity between processors/memory controllers and memories is also a key to achieving reduced latency. High bandwidth (high clock rates) require terminated lines, reduced loads, etc.

It would be highly desirable to provide an apparatus and method for eliminating the protective devices of logic and memory chips/devices in the final assembly so that memory and processor performance may be enhanced without increasing electrostatic charge sensitivity of the logic or memory chip/device.

It would additionally be desirable to provide an apparatus and method for eliminating the protective devices of memory chips/chips by implementing a novel fuse structure in the protective device that may be blown after final packaging in order to eliminate loading of the protective device.

Furthermore, it would be desirable to more tightly/closely couple memory and processor chips, by providing a novel stacked memory chip/device structure that eliminates excessive capacitive and inductive loading in single and multi-processor systems in order to achieve lower latency and higher-bandwidth operation.

Finally, as prior art laser fuse devices must be blown at the wafer level prior to packaging and module burn-in, stresses may be introduced onto the chip that can promote circuit fails and performance anomalies. Laser fuses cannot be blown after circuit encapsulation and, therefore, cannot be used to correct circuit problems introduced during final module build. Thus, it would be highly desirable to provide a novel electrical fuse device, that enables circuit binning and repair to be accomplished after chip encapsulation which serves to enhance over all product yield.

SUMMARY OF THE INVENTION

It is an object of the present invention to provide a novel electronic fuse structure for integrated circuits that is fabricated for connection between a protective device and active circuitry that is connected to an I/O pad of the semiconductor chip circuit, and that may be blown after final assembly for disconnecting the protective device and reducing load impedance at the I/O pad connection.

It is another object of the present invention to provide an apparatus and method for reducing load impedance at an input or I/O pad connection of an integrated semi-conductor chip circuit that requires blowing of a novel electronic fuse structure for disconnecting one or more off-chip driver (OCD) circuits connected between the input or I/O pad and active chip circuitry.

It is a further object of the invention to more tightly/closely couple memory and processor chips, by providing a novel stacked memory chip/device structure that eliminates excessive capacitive and inductive loading in single and multi-processor systems in order to achieve lower latency and higher-bandwidth operation.

Yet another object of the present invention is to provide a novel electronic fuse structure for integrated circuits that may be blown for accomplishing circuit binning and repair after chip encapsulation.

According to a first aspect of the invention, there is provided a system and method for reducing impedance loading of semiconductor integrated circuit devices implementing protective device structures that contributes to impedance loading at an I/O pad connection. The method comprises providing a fuse device between the I/O pad connection and the protective device; connecting a current source device associated with each fuse device in the integrated circuit, the current source device connected to one end of the fuse device; providing fuse selection circuit for activating current flow through a selected fuse device between the current source and the I/O connection, the current flow being of an amount sufficient for blowing the fuse and disconnecting the protective device from the circuit structure, thereby reducing impedance loading at the I/O connection.

Advantageously, the invention is well suited for implementation in DRAM, SRAM, logic and other circuits that may require the blowing of over a thousand lines, for example, during manufacture.

According to a further aspect of the invention, there is provided a system comprising integrated circuit chips disposed in a stacked relation, each chip comprising: a layer of active circuitry formed at a first layer of each chip; a plurality of through conducting structures disposed substantially vertically through each chip for enabling electronic connection with active circuitry at the first layer; second conducting means disposed at an end of the through conducting means at an opposite side of a chip for connection with a corresponding through conductive means of an adjacent stacked chip, the stacked chip structure formed by aligning one or more through conducting structures and second conducting means of adjacent chips, whereby a chip of the stack is electronically connected to active circuitry formed on other chips of the stack. Advantageously, the stacked chip structure is ideal for reducing data access latency in memory systems employing memory chips such as DRAM.

BRIEF DESCRIPTION OF THE DRAWINGS

Further features, aspects and advantages of the apparatus and methods of the present invention will become better understood with regard to the following description, appended claims, and accompanying drawings where:

FIG. 5(*a*) depicts an example computer processor and memory system 95 including multiple memory modules that are connected in parallel and present a high capacitance load on the processor.

FIGS. 5(*a*)(1) and 5(*a*)(2) depict examples of a computer processor and memory system 95' which presents a lighter load to an OCD than the system 95 of FIG. 5(*a*).

FIG. 5(*b*) depicts a further example of a computer processor and memory system 95" comprising unpackaged (bare) CPU and memory module chips connected to a card, board or substrate via solder bumps.

FIG. 6(*a*)(1) illustrates the conduction path implemented during the blowing of a fuse for disconnecting large OCD stage of FIG. 6(*a*).

FIG. 6(*a*)(2) depicts the equivalent circuit structure of FIG. 6(*b*) and FIG. 6(*a*)(3) depicts the physical circuit embodiment of FIG. 6(*b*).

FIG. 6(*b*) illustrates a variation of the circuit structure for reducing capacitive loading of a memory chip/device, e.g., a DRAM chip according to the invention.

FIG. 6(*c*) depicts a circuit implementation 180 for blowing an electronic fuse device 50 in a circuit binning application.

FIG. 7(*b*) illustrates an application of a fuse selection and blow circuit for providing process variation in a voltage swing receiver circuit.

FIG. 7(*c*) illustrates an application of a fuse selection and blow circuit for providing process variation in an adjustable voltage divider network circuit.

FIGS. 8(*b*) and 8(*c*) illustrate a cross section and a top view, respectively, of a two chip stack consisting of DRAM memory chips bumped on a flex or Teflon carrier.

FIG. 9(*b*) illustrates a laser drilled hole in a semiconductor chip with an inner conductor, an outer conductor, and an insulator between the conductors.

DETAILED DESCRIPTION OF THE PREFERRED EMBODIMENTS OF THE INVENTION

Figure 1:
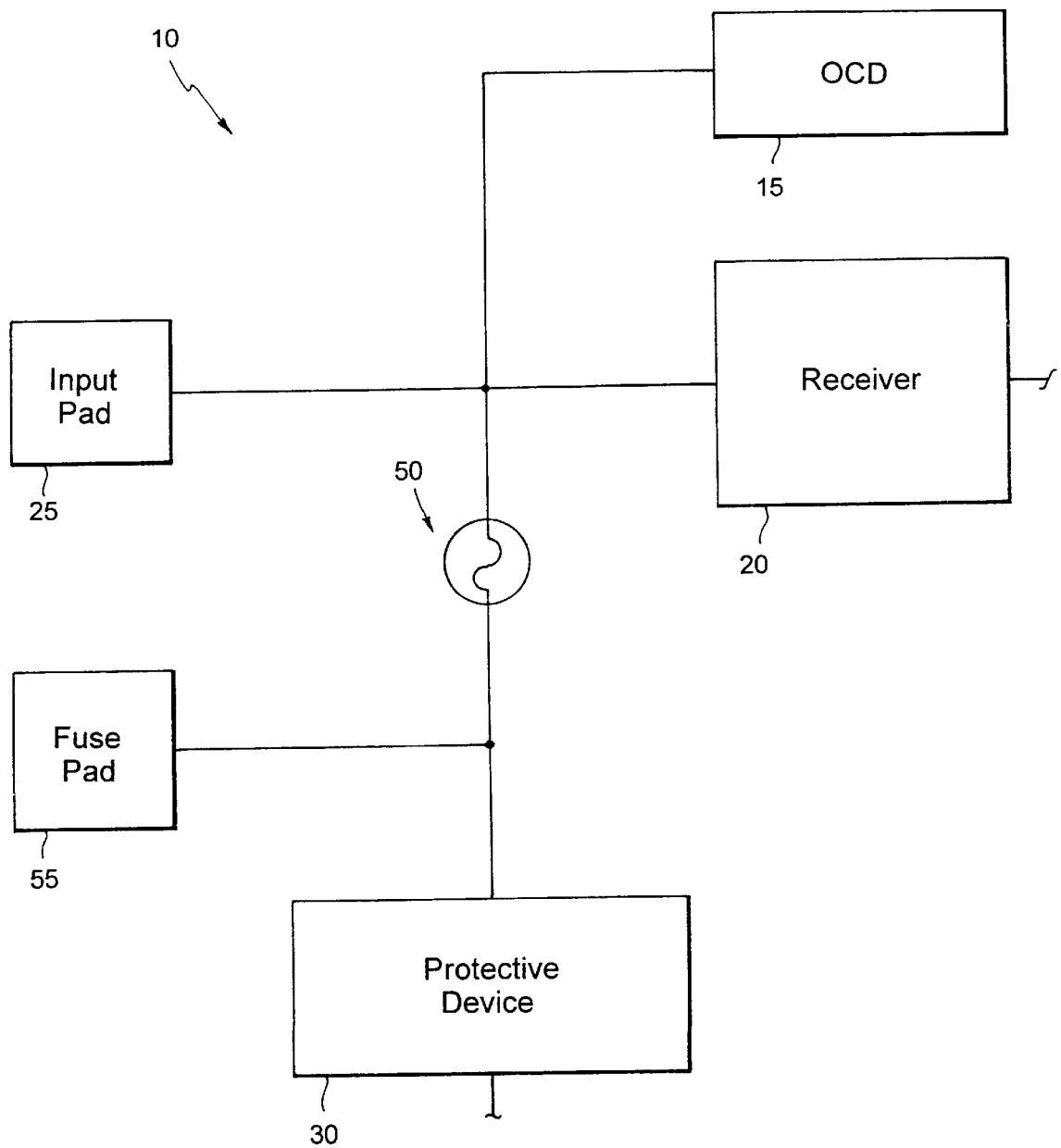
FIG. 1 illustrates a circuit structure 10 for reducing capacitive loading of a memory chip/device, e.g., a DRAM chip, according to a first embodiment of the invention.

FIG. 1 illustrates a circuit structure 10 for reducing capacitive loading of a memory chip/device, e.g., a DRAM chip, having a common input/output terminal according to a first embodiment of the invention. As shown in FIG. 1, an off-chip device (OCD) 15, for example, a device for communicating to a next chip, and a receiver device 20 for receiving address/data signals from a previous chip, for example, are both connected to an input pad 25 which is the physical input for the chip. A commonly known protective device or circuit 30 is built into the structure in order to protect the receiver and OCD devices from destructive electrostatic discharge (ESD) during manufacture and handling. According to the invention, the protective device 30 is removed from the structure 10 after the chip has been placed in the final assembly, e.g., in a module or directly mounted on a substrate or printed circuit board with other chips, by positioning and subsequently opening a fuse device 50 in the structure between the input pad connection and the protective device. That is, by injecting a suitable amount of current between the input pad 25 connecting one end of the fuse 50 and an associated fuse pad 55 connecting an opposite end of the fuse 50 and which is brought outside the structure according to the first embodiment, the fuse device 50 may be blown, resulting in the decoupling of the protective device from the input pad and the receiver and the reduction of capacitance at the input pad 25. Thus, for example, in a memory with common input/output terminal having a combined receiver and output driver capacitance of 3.25 pf and a protective device loading of 1.5 pf, for example, the input capacitance may be reduced from 4.75 to 3.25 pf in the final assembly, a reduction of 32% in capacitive load. For a logic input, the input capacitance of an interface circuit (not shown) may be 0.25 pf, and the protective device may add 1.5 pf.

The input pad capacitance will then be reduced from 1.75 pf to 0.25 pf after the module (or chip) is in the final assembly, a capacitance reduction of 87.5%.

In the embodiment of FIG. 1, it may not be desirable to add extra fuse pads 55 for the purposes of altering the input impedance by fuse blow. FIG. 2(*a*) illustrates a memory module circuit structure 100 for reducing capacitive loading of a memory chip/device having a common input/output terminal 75 according to a second embodiment of the invention. As shown in FIG. 2(*a*), for each input/output pad 75*a*, . . . ,75*n*, there is provided a corresponding transistor device, e.g., MOS FET devices 80*a*, . . . ,80*n*, with each transistor device having a first terminal, e.g., source or drain 81*a*, . . . ,81*n*, connected to the node between the novel fuse device 50*a*, . . . ,50*n*, and the respective protective device 30a, . . . ,30n and, a second terminal, e.g., drain or source, 82a, . . . ,82n, respectively, connected to the chip power supply 60. The transistor device gates 83a, . . . ,83n, respectively, are controlled by a fuse selection decoder device 90 which is activated using unused test mode patterns. For example, when activated in the final assembly, the fuse selection decoder 90 receives an input or command signal 92 from an external logic or control device (not shown) and generates a respective control signal 85a, . . . ,85n for activating a respective transistor gate 83a, . . . ,83n, so that an amount of current sufficient to blow the fuses, e.g., about 10.0 to 200 milliamps of current, is passed through the fuse. In this manner, the protective devices are removed without the provision of an extra fuse pad. It should be understood that individual fuses to be blown may be selected one at a time, or sequentially, for example, in response to a scan chain control signal such as hereinafter described in greater detail with respect to FIG. 6(b). The current is supplied from the product power supply connection and does not require a special high-voltage connection.

Thus, for example, if an address line connects to eight (8) chip inputs on eight modules, then there are eight protective devices attached to the connections. If $C_{diode}=1.5$ pf (not shown), then the total protective device loading for the address line is 12 pf. If seven (7) protective device fuses are "blown", then 1.5 pf of protective device loading remains on the input lead. If all eight (8) fuses are blown, then the protective device portion of loading is reduced to zero. In cases where the memory assembly uses an ASIC chip as a buffer, then there may be no need for any protective device connections to remain in the memory chips. Reducing loading on the address busses will substantially increase the performance of the memory assembly because of faster waveform transitions, less skew, and less reflections.

In accordance with the second embodiment of the invention, it is important to maintain the integrity of each protective device 30 and also to properly integrate the novel fuse 50a, . . . ,50n, and transistor 80a, . . . ,80n, with the circuit structure. FIGS. 3(a) and 3(b) illustrate photomicrographic depictions of a top view of such an arrangement. As shown in FIG. 3(a), a standard protective device 30 is used with both PN and NP junctions in a CMOS process. The protective device 30 typically includes a series resistance 31, e.g., 10 to 30 ohms, and, as shown in FIG. 3(a), is designed as multiple resistor paths, e.g., eight paths 32a, . . . ,32h. The protective device and series resistor are typically fabricated in the tungsten layer 40 of a DRAM, for example, however, the same configuration may be used with aluminum or copper metallurgy, and the chip may be a logic chip, SRAM, flash, or any other type of chip. The fuse selection transistor, e.g., 80, is shown with multiple contacts 91 to the metallurgy between the series resistor 31 and the protective device 30. The transistor may be activated to provide current from the power supply 60 through the body of the transistor 80, (FIG. 2(a)), through the resistor branches 32a, . . . ,32h, [FIG. 3(a)] and to a grounded input pad 75. Preferably, the resistance segments 32a, . . . ,32h are built to also behave as fuses.

FIG. 3(b) illustrates an example physical layout of two transistor devices optimized to provide sufficient current for blowing two fuses, simultaneously or individually, in accordance with the second embodiment structure 100. Illustrated in FIG. 3(b) are fuse lines 52a,b, transistor gate lines 83a,b, and power supply 60. For example, using NMOS FET transistor at 400 µA/µm, a width W of the transistor may be 25 µm; using PMOS FET transistor at 150 µA/µm, a width W of the transistor may be 67 µm. This configuration has been optimized for less than about 10 mA of current for a each transistor operating at 2.5 V. Part of the optimization process consists of increasing the thermal resistance between fuse lines 52a,b and substrate in region 41, as described below.

As is generally known, metal fuses are difficult to drive to an open state, or to blow, because it is difficult for relatively small amounts of current to cause a metal line to open. The reason is that silicon is an excellent heat sink, and insulators (with relatively poor heat conduction properties) still provide a cooling path which prevents the metal from heating rapidly and efficiently to the melting point. Furthermore, if sufficient heat is generated to melt the metal, insulators may be fractured by the evaporated metal. As described in greater detail in commonly-owned, co-pending U.S. patent application Ser. Nos. 09/303,509 and 09/303,042 the contents and disclosure of each of which is incorporated by reference as if fully set forth herein, one solution is to provide a length of wire spanning an open region with no insulator to allow the very-thin metal lines, e.g., 300 nm in width, to rapidly heat and open. The design of the novel fuse device 50 according to the embodiment described herein is based on the principles described in the following reference: H. A. Schafft, "Thermal Analysis of Electromigration Test Structures", IEEE Transactions on Electron Devices, Vol. ED-34, No. 3, March 1987, the contents and disclosure of which is incorporated by reference as if fully set forth herein. The reference shows that the temperature of a doped polysilicon, silicided polysilicon line, or a metal line is given by equation (1) as follows:

$$T = T_{ambient} + \frac{(J^2) \cdot \rho}{((K_{therm\ cond} \cdot \text{Ratio of dimensions}) - (J^2) \cdot \rho \cdot B))} \quad (1)$$

where:

ρ=resistivity of the metal in Ω-cm;

J=current density in the metal in Amperes/cm²;

$K_{thermal\ coefficient}$=thermal conductivity of the insulator in Watts/cm°K.; and, B=temperature coefficient of resistivity.

Thus, according to the invention, it is possible to decouple segments of metal conductors from the insulating material and make $K_{thermal\ coefficient}$ of the insulator very small. That is, the thermal coefficient in equation (1) may be controlled by design. The denominator of equation 1 comprises a thermal conduction portion minus a heating portion. If the thermal coefficient of conduction is reduced, then for that portion of the line segment, it is possible to produce heating in the metal conductor doped polysilicon or silicided polysilicon line with a small current, and cause rapid heating and evaporation of a line, e.g., polysilicon or metal, such as tungsten, aluminum, copper, etc. In fact, the current needed may be adjusted by the structure.

Figure 3A:
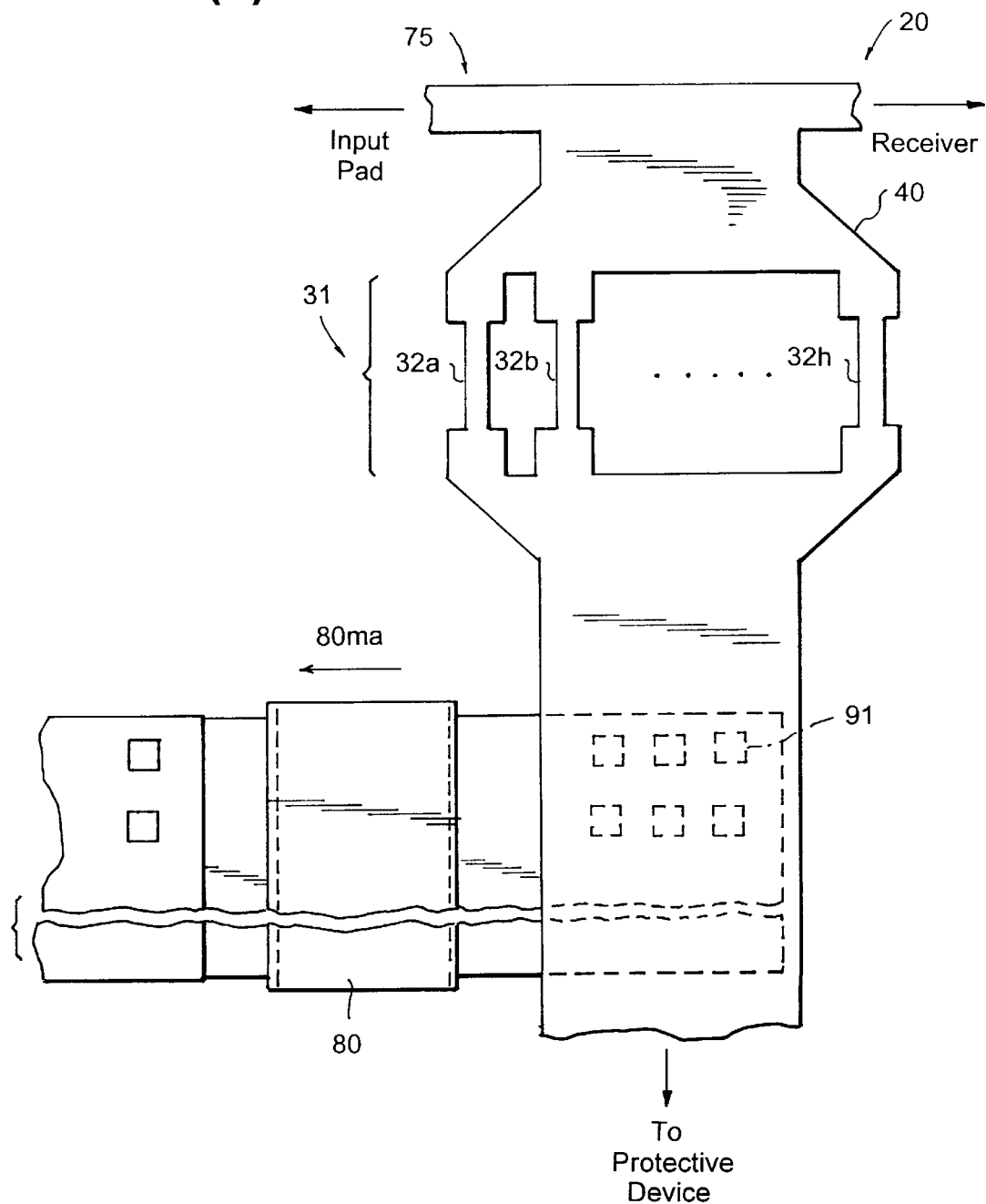
FIGS. 3(*a*) and 3(*b*) illustrate photomicrographic depictions of a top view of the circuit according to a second embodiment of the invention.
Figure 3B:
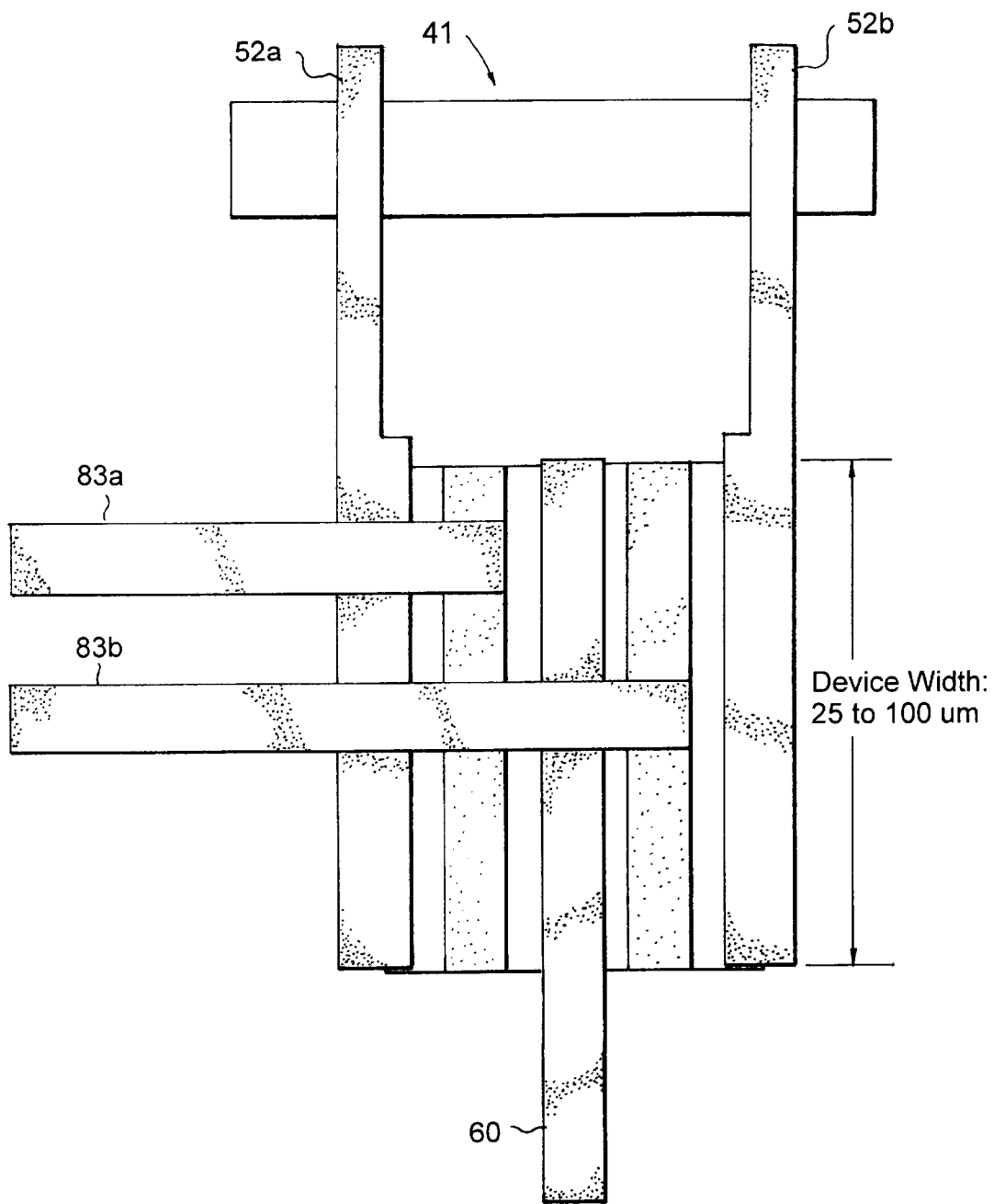
Figure 4A:
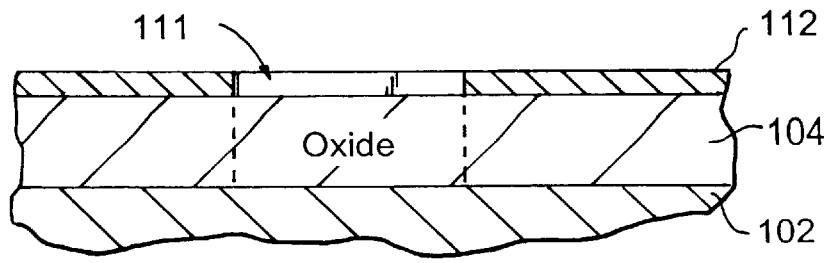
FIGS. 4(*a*)–4(*c*) illustrate the sequence used to build a novel fuse structure according to the invention.
Figure 4B:
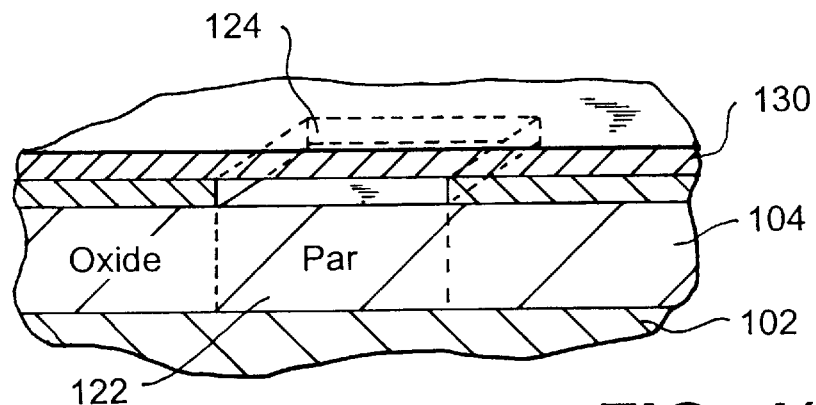
Figure 4C:
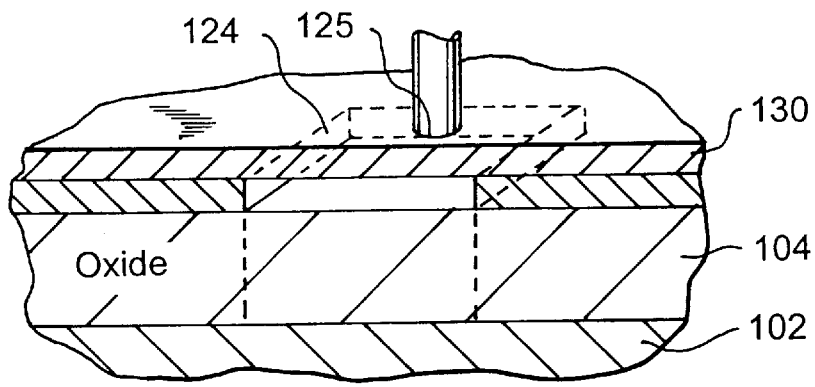
Figure 4D:
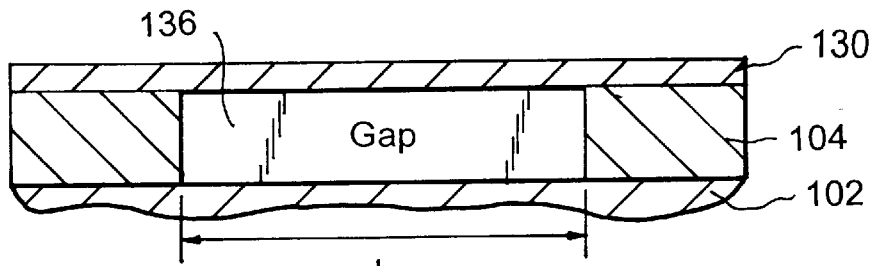

FIGS. 4(a)–4(c) illustrate the sequence used to build such a structure. As shown in FIG. 4(a), a top silicon substrate 102 is a dielectric layer 104 (oxide, for example). A photoresist (mask) layer 112 is laid down having an open section 111 which is etched, filled with paralene wax, and planarized. A metal 130 is deposited on top of the insulator and paralene regions 122. The metal is etched (patterns defined) such as shown in FIG. 4(b) and, an opening 125 is etched in an elongated paralene window 124 formed beyond the metal into the paralene, as shown in FIG. 4(c). The wafer is heated to between 100 to 150 deg C., for example, so that the paralene boils and evaporates though the hole 125. Additional dielectric layers in the process close the opening, leaving a portion of the metal over an air gap (cavity) 136 in dielectric 104, supported by dielectric 104, as shown in the cross-sectional view of FIG. 4(*d*). It should be understood that according to the principles described herein, that an air gap may be formed above and to the sides of a conductor to thereby fully expose a conducting line segment for fusing or high performance line applications. The heat path through oxide dielectric 104 in region 111 to the silicon is interrupted below a length of metal. The length of metal 130 shown in FIG. 4(*c*) is the resistive connection of FIG. 3(*a*). In this example, there are eight (8) parallel segments which may be 10 to 30 ohms, for example, such that each leg is 80 to 240 ohms. If tungsten metallurgy is used (1.5 ohms/square), and 2 $\mu$m in width, then 50 squares or 100 $\mu$m length per leg. For eight (8) parallel segments of about 1 ohm, then each leg is 8 ohms, and a length of 5.3 squares of 10.6 $\mu$m in length. The paralene opening 136 below the line segments may be 10 $\mu$m–100 $\mu$m, for example, leaving a region which gets sufficiently hot to melt at relatively low currents, 5 to 10 ma/leg or 40 to 80 ma for the structure at typical power supply voltages of 3.3 V, 2.5 V or even lower voltages. Note that it is possible to create an opening (not shown) above the metal line segment, if desired.

The line segments of the protective device are designed to handle an ESD pulse of short duration. The lines will not heat up and therefore will not act as fuses during an ESD event. However, subsequent heating, caused by dc current (repeated pulses may be used instead), will cause the resistor element 31 to melt and open in the region between the inner dimensions of the opening beneath the metal layer.

The fuse application has been described in terms of the elimination of the parasitic capacitance of a protective device after the handling exposure has been eliminated. The fuse, however, is a very versatile element and is capable of many other applications. An example using Off Chip Drivers (OCDs) will now be described.

The size of an OCD depends on the load to be driven which may be on a logic chip or on a memory chip. FIG. 2(*b*) illustrates a memory module device 100' which is a modification of the memory module 100 of FIG. 2(*a*) as it comprises two OCDs per pad, referred to as OCD 15 and OCD 15'. Although the example is given in terms of two OCDs, it is understood that more than two OCDs per I/O pad 75*a*, . . . ,75*n* may be used. In the new configuration of FIG. 2(*b*), the OCDs are designed/optimized to drive two different loads. For example, the first OCD 15 is designed to drive a small load, 5 pf, for example. A small load would occur if the memory I/O pad is in close proximity to the logic and there is a single, unshared connection, usually referred to as a point-to-point connection. By optimizing the driver to a small load, it is possible to dissipate less power in the OCD and obtain a tailored fast transition with less delay than in going through an OCD of much larger capacity. The OCD 15 itself presents a load of approximately 1 pf, for example. The second OCD 15' is capable of driving a much larger load. An example would be eight or even more DRAM modules in parallel on a memory bus driven by a logic chip. In this case, driver OCD 151 may be required to drive a 100 pf load. Accordingly, OCD 15' would have more stages of amplification (and, therefore, more delay) than OCD 15, and its output devices would be much larger, etc. For instance, OCD 15' may have to drive approximately 100 ma at a duty cycle of up to 50% such that its maximum average current would be 50 ma. OCD 15' itself may present a load of approximately 3 pf, for example.

As shown in FIG. 2(*b*), additional fuse selection transistor devices 80*a*, . . . ,80*n*' are provided placed between one side of a respective additional fuse device, 50*a*', . . . ,50*n*' and the power supply connection 60. The transistors 80*a*', . . . ,80*n*' may be selected using the Fuse Selection Decoder 90. Each transistor 80' connection and its respective fuse 50' is attached to OCD 15' because it drives large load of 100 pf and will have the least impact from the extra capacitance associated with the fuse select transistor. The fuse element is thus designed to allow 50 ma DC current (100 ma with 50% duty cycle) without being activated. Preferably, an activation current of 150 ma is selected to heat/blow (program) the fuse 50'. The first select transistor 80*a*', for example, may have a 400 uA/$\mu$m (NMOS) capability so the transistor needs a width of 375 $\mu$m to supply the desired current. The transistor will add approximately 0.5 pf of load to OCD 15'. If OCD 15' is isolated by blowing the fuse, there is no extra loading for OCD 15.

FIG. 5(*a*) illustrates a computer processor and memory system 95 including a Central Processor Unit (CPU) 97 (or memory controller) and plastic encapsulated multiple memory modules 98*a*, . . . ,98*n* mounted on a board 93 that are connected in parallel via interconnection 99. In the configuration of FIG. 5(*a*), the parallel connection of memory modules 98*a*, . . . ,98*n* presents a high capacitance load on the processor 97, thus requiring the large driver OCD 15' of FIG. 2(*b*). It is also possible for large loads to activate both OCD 15 and OCD 15' (FIG. 2(*b*)) enabling OCD 15' to be physically smaller than if it otherwise had to supply all the current for a large load. It should be understood that the number of OCD devices 15 and 15' shown in FIG. 2(*b*) may be tailored in size according to the amount of loading so as to provide the best drive ability (rapid transition with lower power dissipation). For an input/output (I/O) line, both OCD and receiver loading is present.

The module capacitive loading on the CPU/memory connection may be significantly reduced by electrically disconnecting the protective device from each module pin after the modules are mounted and no longer require ESD protection. In this example, the module pins are assumed to be input/output pins (I/O) which can both receive signals from the CPU (input) and send data to the CPU (output). Each output driver is assumed to present a load of about 3 pf, for example, at the I/O pin, a receiver contributes a load of about 0.25 pf, for example, and the protective diode contributes about 1.5 pf, for example. Thus, each memory pin presents a total load of about 4.75 pf with the protective device (PD) connected. Similarly, the CPU also has about 4.75 pf of loading. If one of sixteen memory module is selected to supply information to the CPU, the other fifteen are off. They present a load of about 76 pf to the memory bus. In addition, the CPU presents a load of about 4.75 pf, for a total load on the driving memory module of about 80.75 pf. If the protective devices of the memory are disconnected using a programming mode after mounting, the capacitance per memory connection is reduced to about 3.25 pf. The CPU node can similarly be reduced to about 3.25 pf. The total load for a memory module supplying data to the memory/CPU connection (sometimes referred to as the memory bus) is reduced to about 55.25 pf, a reduction of 32%. Since the power dissipation is proportional to the capacitive loading, the power dissipation is reduced by 32%. The traces used to interconnect the memory and CPU will also contribute capacitance, however, the capacitive loading will be primarily due to the loading of the module pins.

FIGS. 5(*a*)(1) and 5(*a*)(2) is an example of a computer processor and memory system 95' which presents a lighter load to an OCD than the system 95 of FIG. 5(*a*). The system 95' in FIGS. 5(*a*)(1),(2) maintains single connection between the CPU 97' and memory, which is herein referred to as a point-to-point connection. As shown, there are only four memory modules 98a', . . . ,98n' connected to the processor 97' such as to minimize physical distance to the CPU. The cross sectional view of 5(a)(2) shows the CPU 97' and a memory module 98' both fully encapsulated on the card or board 93 (or on a substrate of ceramic or organic material such as a flex carrier). FIG. 5(b) is another example of a computer processor and memory system 95" comprising unpackaged (bare) CPU 97" and memory module 98" chips connected to a card or board 93 or substrate via solder bumps 96. The CPU 97" and memory module 98" chips are now spaced even closer together thus, providing an even lower capacitive loading, as the other systems 95' and 95. Accordingly, for such a load, the smaller capacity driver OCD 15 (FIG. 2(b)) may be used, with the larger driver OCD 15' disconnected by blowing its respective fuse device.

Assuming an I/O line, short distance point-to-point connection between memory and CPU, a small (OCD) driver because of the light loading, and negligible additional capacitive loading due to the traces providing the CPU/memory connection, the capacitive loading per I/O line with protective diode connected is 2.25 pf (small OCD=0.5 pf, receiver=0.25 pf, and PD=1.5 pf). With one memory and one CPU connection, the capacitive load is 4.5 pf. With the protective devices disconnected on the CPU and the memory, the capacitive loading is reduced to 1.5 pf. This results in a reduction in capacitive loading of 67%, with a corresponding reduction in power dissipation of 67%.

In the examples given, the memory chip and CPU or microprocessor chips have all been separate. However, as levels of integration increase, there corresponds an increase in the amount of functions on a chip. Thus, a chip may be quite large, e.g., 20 mm or more on a side, with multiple memory functions, multiple microprocessor functions, etc., on one chip. These may be physically interconnected with relatively long busses and may have a range of loading from low to high values, etc. It is desirable in such situations to be able to modify the OCD between larger and smaller OCDs which depends on the loading of the on-chip bus. Therefore, the ability to electronically reconfigure a driver from a large OCD with 3 pf of load to a small OCD with 0.5 pf of loading, for example, inside a chip, is just as valuable as in the chip-to-chip cases as described. The above-described techniques are also applicable to internal chip circuits as well.

Figure 2A:
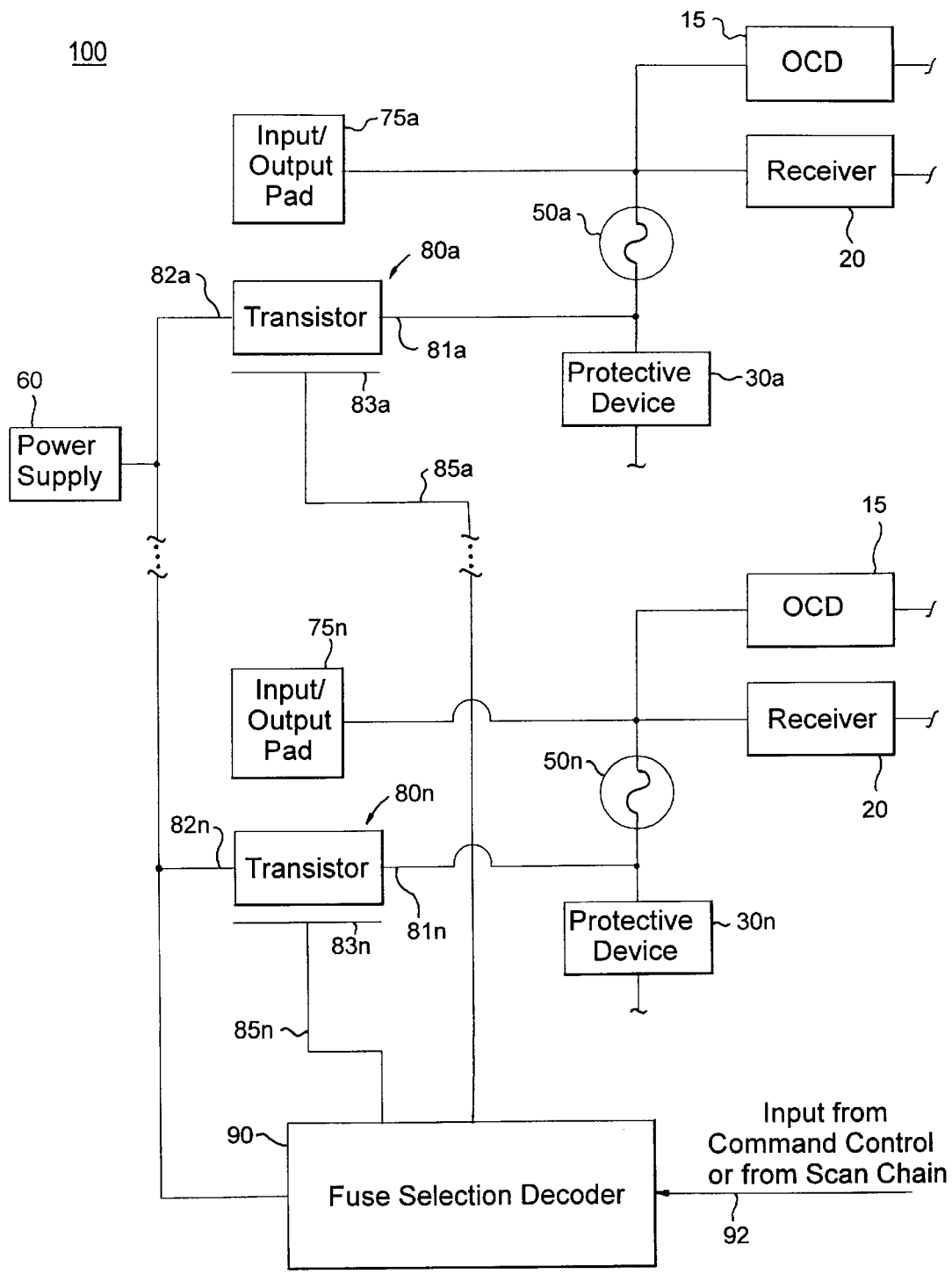
FIG. 2 illustrates a circuit structure 100 for reducing capacitive loading of a memory chip/device according to a second embodiment of the invention.
Figure 2B:
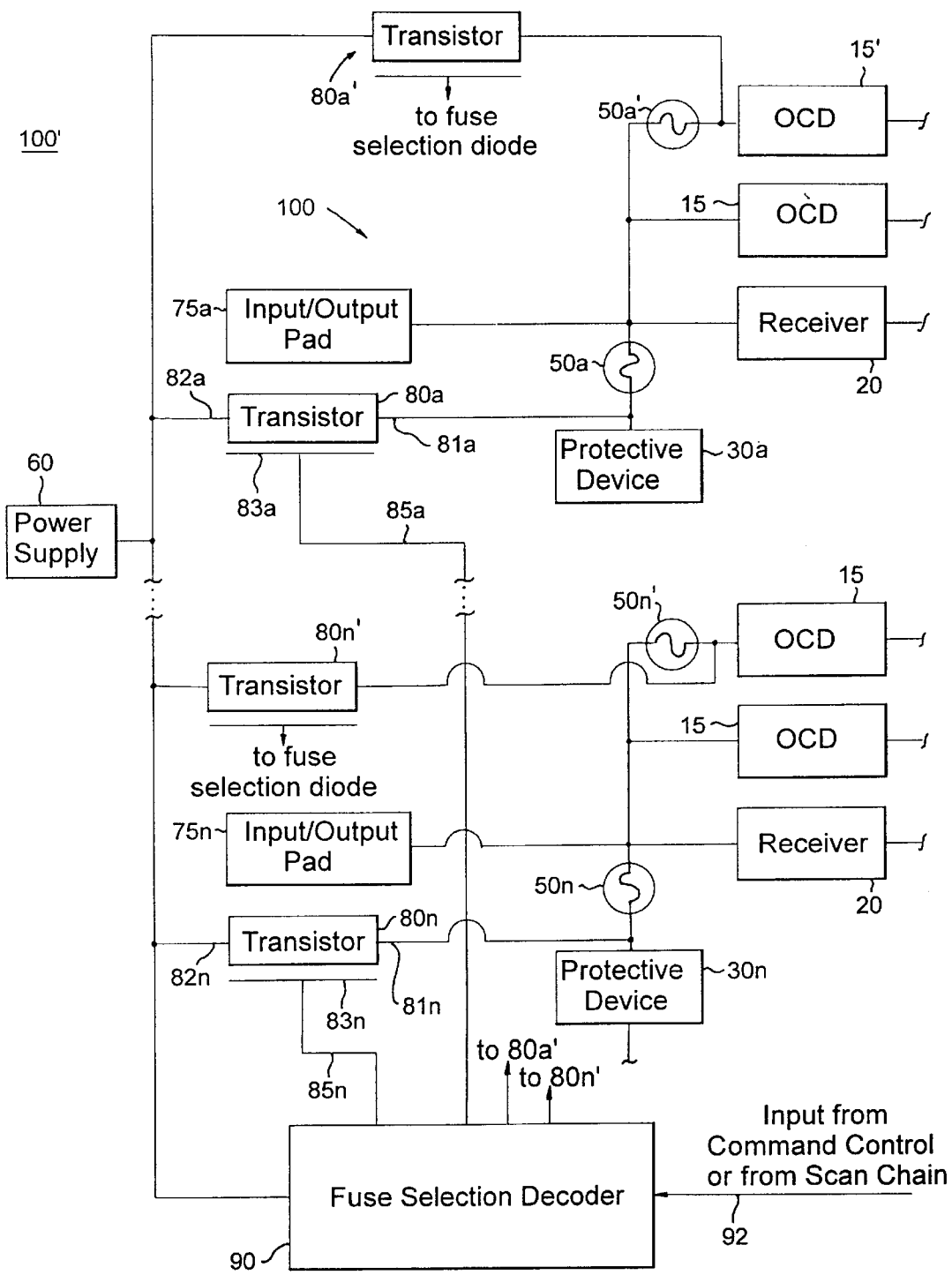
Figure 6A:
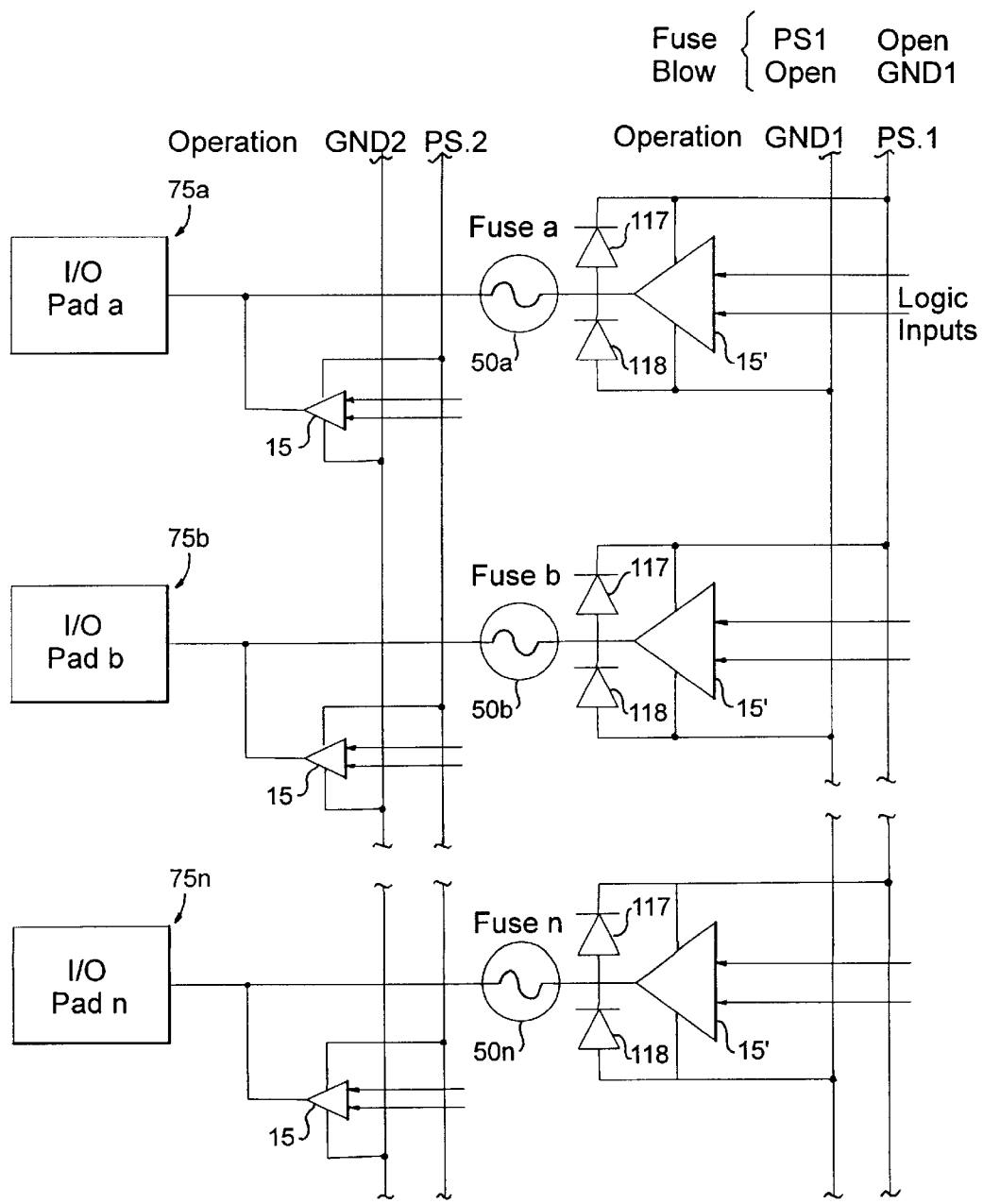
FIG. 6(*a*) illustrates a further embodiment for selectively blowing fuse devices for controlling OCD characteristics, e.g., in memory module device examples of FIGS. 2(*a*) and 2(*b*).
Figure 6B:
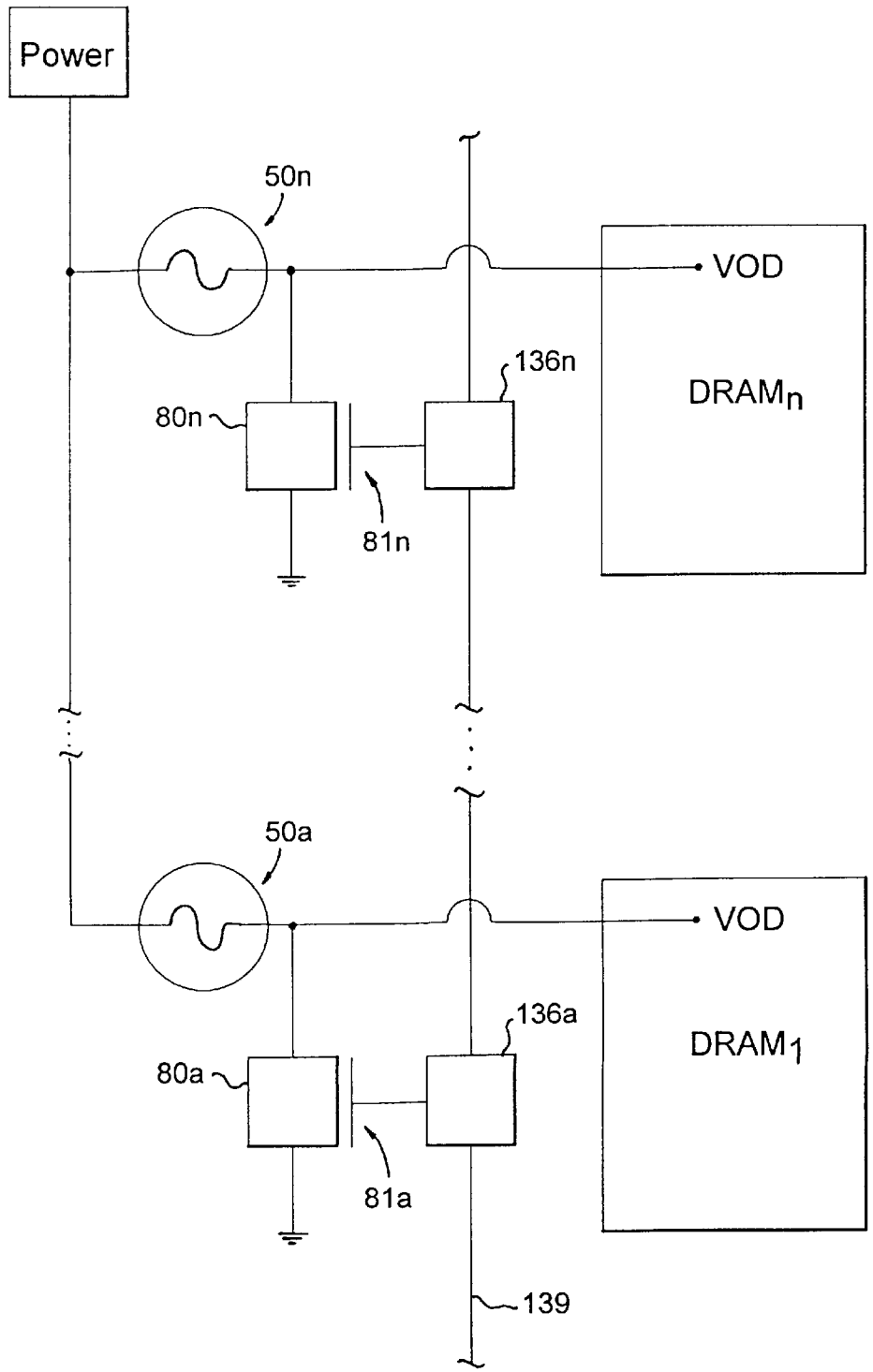

FIG. 6(a) illustrates a further embodiment for selectively blowing fuse devices for controlling OCD characteristics, e.g., in memory module device examples of FIGS. 2(a) and 2(b). First, as OCD devices have large output diffusions, it is often not necessary to have protective devices and they are omitted in the embodiment of FIG. 6(a). Output pads 75a, . . . ,75n are respectively connected to small and large output drivers 15, 15', respectively, as in FIG. 2(b), with a single fuse device 50a, . . . ,50n at the output of the large driver 15'. Receivers are not shown, making these pads output only, however, it is understood that receivers may be present at the pads making these I/O terminals. What characterizes the embodiment of FIG. 6(a) from the embodiment of FIGS. 2(a) and 2(b), is that fuse selection transistors are not used. Rather, diodes 117,118 which are present between the PMOS and NMOS transistors (not shown) of the OCD output stage are shown connected with N-well and P-well, respectively. These are large diodes, capable of carrying hundreds of milliamps (ma) of current. The N-well and P-well regions are connected, during normal operation, to power supply voltages and ground, indicated as PS1, PS2 and Gnd1, Gnd2, in FIGS. 6(a), 6(a)(1)–6(a)(3). It is possible to select one pad uniquely, power diodes in one direction, and supply enough current to blow the fuses without the need of a special fuse select transistor.

FIG. 6(a)(1) illustrates the conduction path indicated as broken arrow I that is implemented during the blowing of a fuse 50b for disconnecting large OCD stage 15' of FIG. 6(a). As shown in FIG. 6(a)(1), a voltage, e.g., 3.0 V, is applied to pad 75b, while the all other pads are connected to 0.0 V. The N well (diode 117) is forward biased by completing the circuit path to the PS1 line indicated as line 127 which is connected to ground (zero voltage) in order to forward bias diode 117 and program fuse 50b. PS1 is at a positive voltage during normal product operation. Diode 118 is not used to program fuse 50b in this example. FIG. 6(a)(2) depicts the equivalent circuit structure of FIG. 6(b) including novel fuse device 50b, conductive line 148 connecting the fuse with the N-well/P-well regions, and, showing the OCD driver stage comprising a first and second amplifiers having respective gates 143 and 149 receiving logic inputs. FIG. 6(a)(3) depicts the physical circuit embodiment of the circuit portion depicted in FIG. 6(a)(2), and showing current flow indicated as broken line I only for the programming path in which diode 117 is used.

Figure 6C:
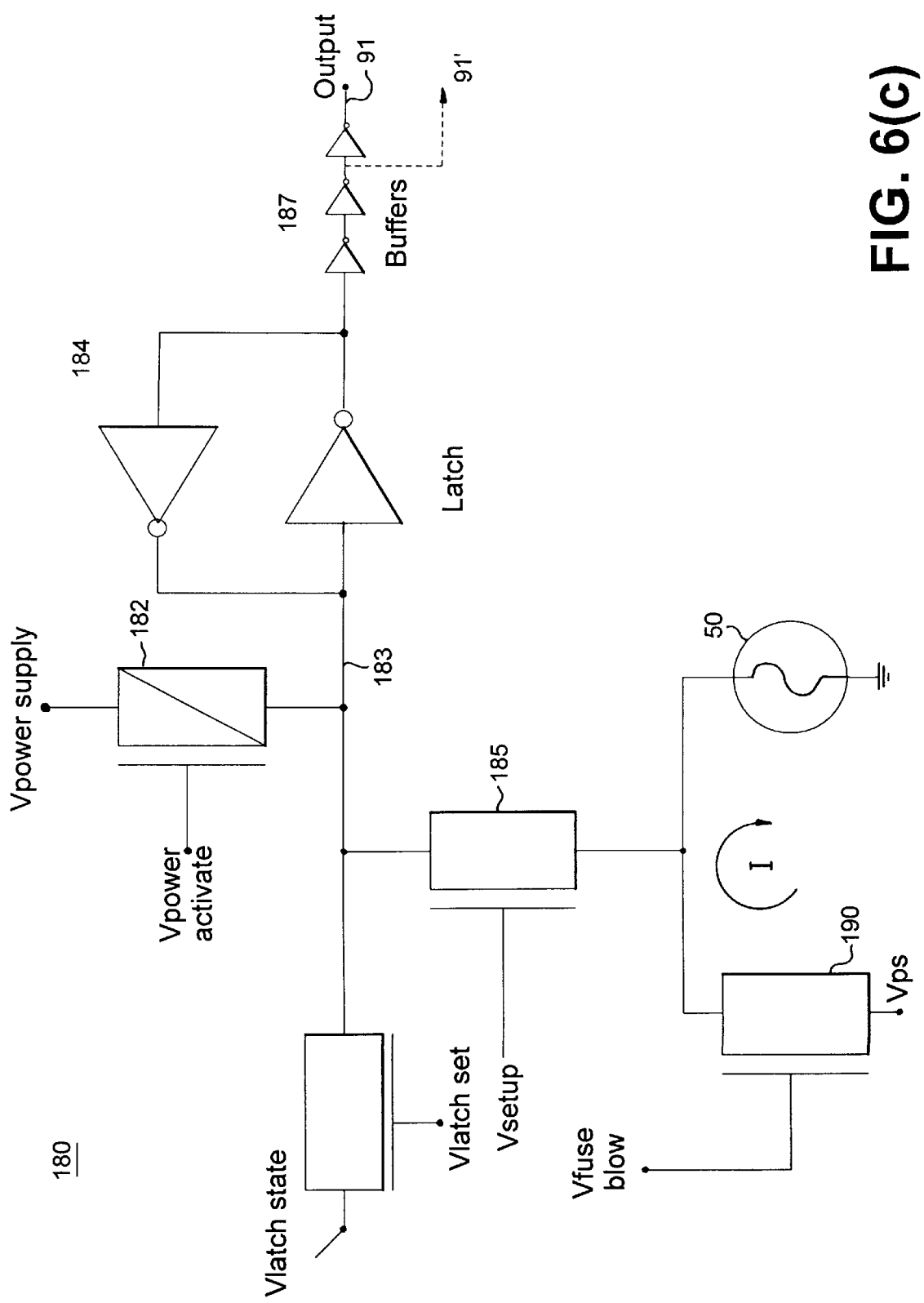

According to the principles of the invention, the fuse selection and blow circuit structures of FIGS. 2(a), 2(b), 6(a), and 6(b) may be implemented to select or de-select an application specific circuit element, or other circuitry in an integrated circuit, e.g., after final test, to reconfigure the circuit. Also, application of such circuits may be used to provide on-chip circuit device binning and tailoring of process windows and variations. Alternately, the fuse device 50 may be integrated within a power activation and fuse blow circuit structure for activating/de-activating particular circuits in a system such as shown and described in commonly-owned, co-pending U.S. patent application Ser. No. 09/303,509, the contents and disclosure of which is incorporated by reference as if fully set forth herein. FIG. 6(c) depicts a circuit implementation 180 for blowing an electronic fuse device 50, e.g., in a circuit binning application, and, which may be operated to provide an indication of a state of a fuse device in an integrated circuit. As shown in FIG. 6(c), the fuse blow circuit includes a latch circuit which, in operation, utilizes a first power activation transistor 182 for charging up a latch node 183 at the input of latch device 184. Thus, in operation, when power is turned on, a $V_{poweractivate}$ signal is activated to flip the Vpower supply latch and provide a logic "1" for instance, at an output 189 through a series of buffers 187. This, of course, assumes that a $V_{setup}$ transistor 185 is inactive (non-conducting). It should be understood that a complementary latch output signal 91' of opposite polarity may tapped off the output of one of the serial buffers 187. Subsequent, to power circuit activation, a check is made to determine the state of the fuse device 50. Thus, the circuit 180 additionally includes a $V_{setup}$ transistor 185 which is fired after the $V_{poweractivate}$ signal is activated. That is, when $V_{setup}$ is fired, the transistor 185 becomes conducting. If the fuse device 50 has not been blown, i.e., is intact, then there is a path created to ground from the latch node 183 through setup transistor 185, which causes generation of a signal of opposite polarity, e.g., a logic "0", at the output 91 through the series of buffers 187. This output indicates that the fuse 50 is intact. If the fuse has been blown, however, in the manner described herein, the path to ground via fuse device 50 is open, and the output voltage signal remains at its activated state, e.g., logic "1," indicating that the fuse has been blown.

The portion of the circuit 180 for blowing a fuse device 50 may include a transistor device 190 having a $V_{fuse\ blow}$ input at its gate for activating fuse blow, a source (or drain) terminal connected to a power supply $V_{ps}$ and, the corresponding drain (or source) terminal connected to ground through the fuse device 50. In operation, as long as $V_{setup}$ transistor 185 is inactive (off), a $V_{fuse\ blow}$ voltage applied to gate of transistor 190 will enable current I to blow the fuse device 50.

Figure 7A:
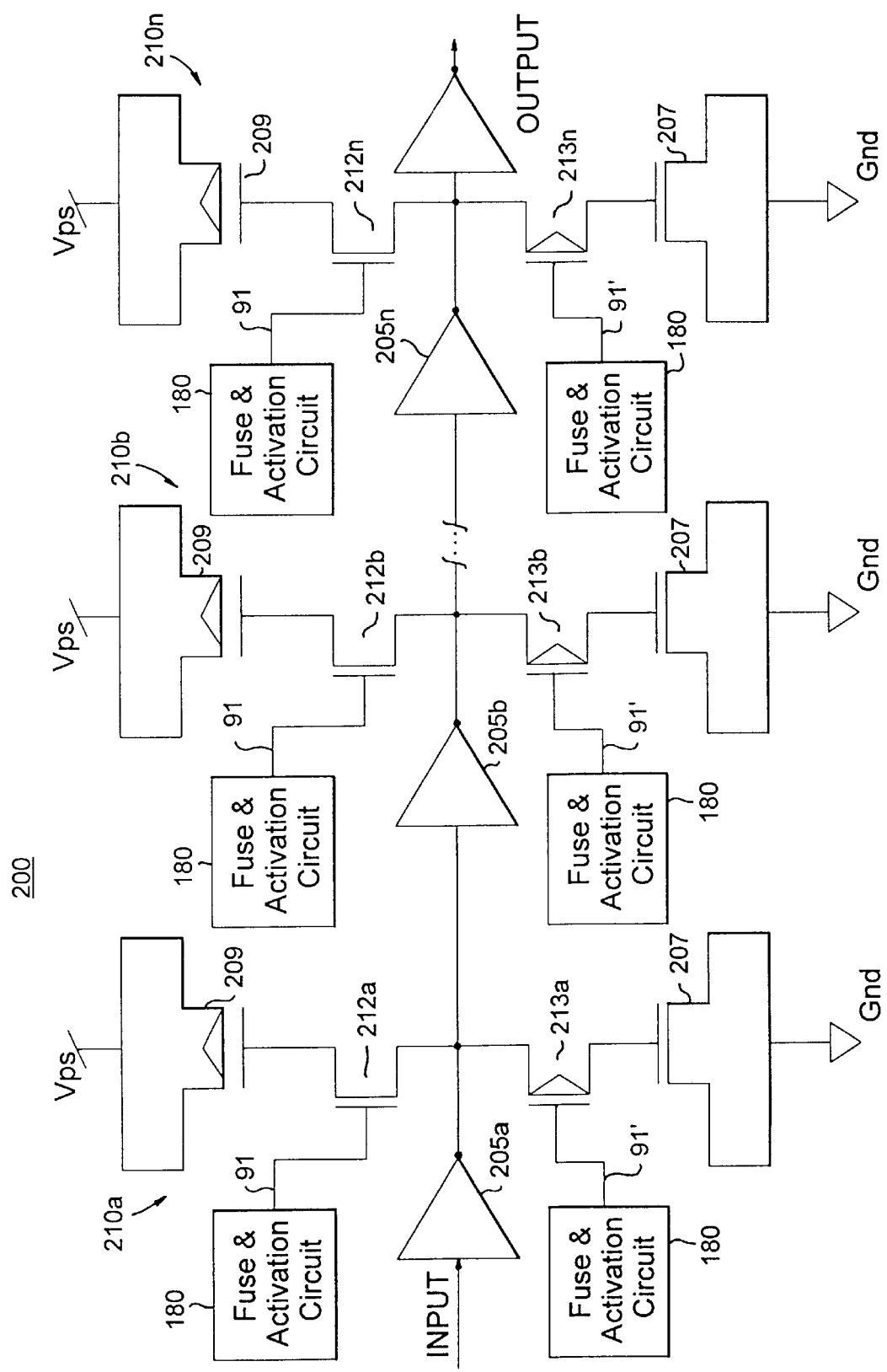
FIG. 7(*a*) illustrates an application of a fuse selection and blow circuit for providing process variation in a variable delay circuit.
Figure 7B:
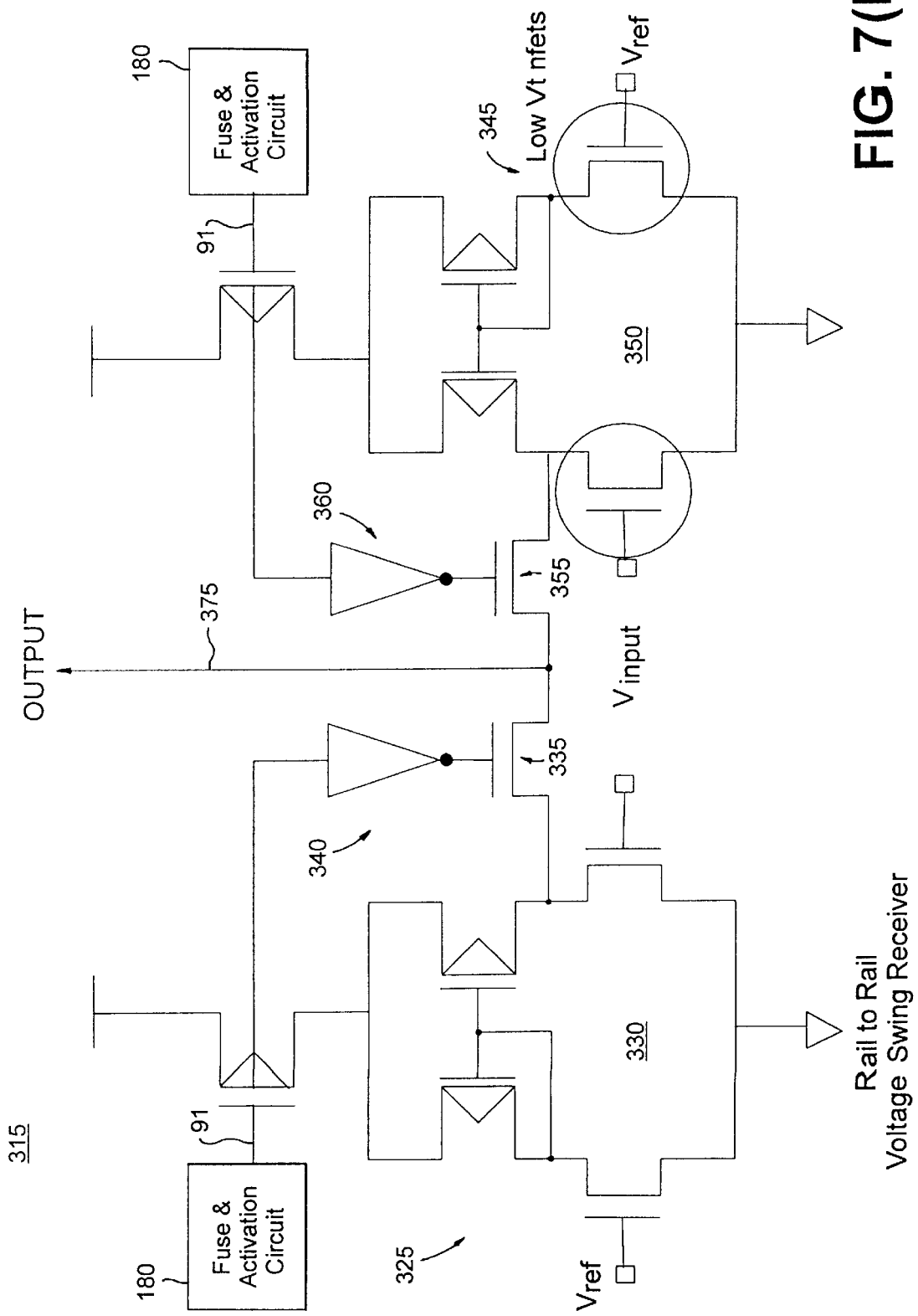
Figure 7C:
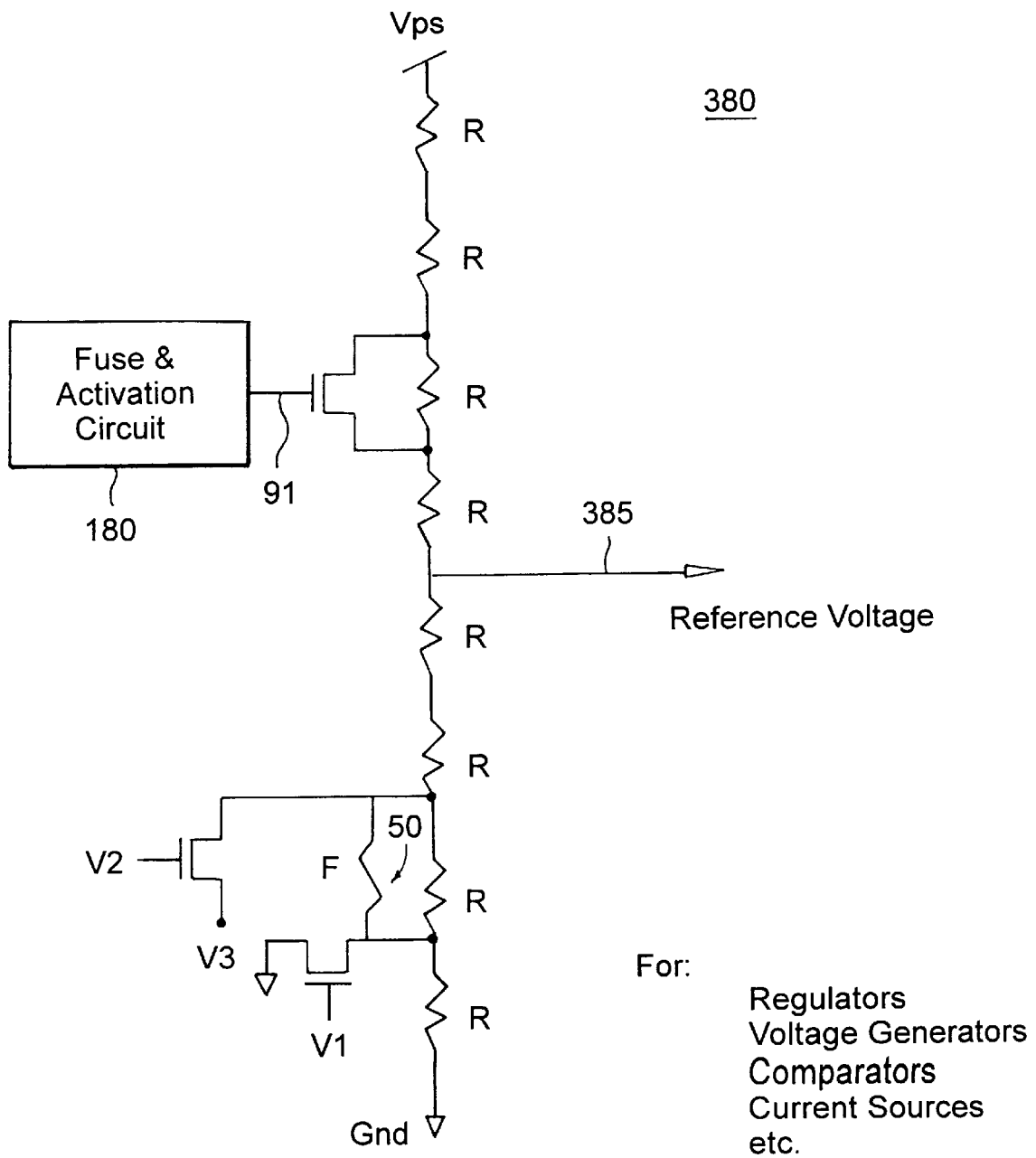

Particularly, in a first circuit binning and process variation window tailoring example, the fuse selection and blow circuit structures described herein may be incorporated in a variable delay circuit 200 an example of which is depicted in FIG. 7(*a*). As shown in FIG. 7(*a*), the variable delay circuit 200 comprises a serial connected chain of inverter circuits 205*a*, . . . ,205*n* which are connected to provide a desired signal delay according to the circuit tuning requirements after module build. A gated capacitance 210*a*, . . . ,210*n* comprising either an NFET transistor 207 connected to a ground or a PFET transistor 209 connected to a power supply is provided at the output of each inverter stage 205*a*, . . . ,205*n* to adjust the drive load and, in turn, slow-down or speed-up propagation of signals through the chain. As described herein, one or more of these circuits may be selected to alter the drive load capacitance and consequently, the propagation speed of the signals. For example, after fabrication, with intact fuse devices 50, the outputs 91 of each fuse blow selection circuit 100 may be normally a logic level 0 (low voltage), which acts to turn off respective transistors 212*a*, . . . ,212*n* thus disconnecting the capacitive loads at the output or each respective inverter stage. Likewise, the outputs 91' of each fuse and activation circuits 100 may be normally a logic level 1 (high voltage), which acts to turn off respective transistors 213*a*, . . . ,213*n* thus disconnecting the capacitive loads at the output or each inverter stage. However, upon determination that an amount of delay in the inverter chain is required for a particular circuit application, one or more of the fuse devices 50 the circuit of FIGS. 2(*a*), 2(*b*), 6(*a*), 6(*b*) may be electrically blown in the manner as described herein. Thus, the output signal 91 may change to a logic 1, for example, which results in turning on one or more of transistors 212*a*, . . . ,212*n* thus connecting the respective capacitive load 209 at the output of the selected inverter stage(s). Likewise, in response to blowing electrical fuses 50 of fuse and activation circuit 100, the output signal 91' may become a logic 0, for example, which results in turning on one or more of transistors 213*a*, . . . ,213*n* thus connecting the respective capacitive load 207 at the output of the selected inverter stage(s). The testing and subsequent blowing of fuses in fuse and activation circuit 100 may be repeated in a recursive manner to obtain the exact delay as required by the circuit application. It should be understood that many circuits in design make use of inverter delays for timing such as input set-up and hold, one-shot timers, and output drive timing, and skilled artisans would be able to implement the fuse and activation circuitry 100 in the manner described herein to tailor circuit performance accordingly.

According to a second circuit binning and process variation window tailoring example, the fuse selection and blow circuit structures described herein may be incorporated in a dual function input receiver circuit 315 an example of which is depicted in FIG. 7(*b*). In FIG. 7(*b*), the dual function input receiver circuit 315 is manufactured to include a rail to rail voltage swing receiver circuit 325 including a differential amplifier circuit 330 receiving a Vref input and a received Vinput, and, a low voltage swing receiver 345 including a differential amplifier 350 for receiving a Vref input and a received Vinput, e.g., a command signal. The output of each differential amplifier circuit 330, 350 is connected respectively through a series transistor 335, 355 to provide the output signal 375, for an off-chip device (OCD), for instance (not shown). Connected with each differential amplifier circuit 330, 350 are respective with the respective fuse selection and blow circuit structure 100 (FIGS. 2(*a*), 2(*b*)). During testing, it may be determined that one of these circuits enables better circuit performance than the other. For example, when implemented in a faster device, the low voltage swing receiver 345 may be desirable, whereas, slower devices may make use of rail-to-rail voltage swing receiver 325. Thus, after testing of the device and knowing the characteristics of the circuit implementing the voltage swing receiver, one of the fuse circuits may be blown to render inactive one of the input receivers. For example, the rail to rail voltage swing receiver 325 may be disconnected by blowing the fuse device 50 of circuit structure 100 connected to the receiver which provides an output signal of logic "1" as described. The logic 1 output 91 effectively de-activates the receiver 325, and, via inverter device 340, will turn-off transistor 335 for greater isolation and reduced loading of the output signal 375. Thus, when in operation, only the faster low voltage swing receiver circuit will be activated. Similarly, the low-voltage swing receiver 345 may be disconnected by blowing the fuse device 50 of circuit structure 100 connected to the receiver which provides an output signal of logic "1" as described. The logic 1 output 91 effectively de-activates the receiver 345, and, via inverter device 360, turn-offs transistor 355 for greater isolation and reduced loading of the output signal 375. Thus, when in operation, only the slower rail-to-rail voltage swing receiver circuit will be activated.

According to a third circuit binning and process variation window tailoring example, the fuse selection and blow circuit structures described herein may be incorporated in an adjustable voltage reference divider network 380 such as depicted in FIG. 7(*c*). As many circuit designs, e.g., regulators, voltage generators, comparators, current sources, and the like, require a voltage reference which usually designates specific operating conditions, an adjustable reference allows adjustable circuit operation. One method employs the fuse blow and selection circuit 100 and technique described with reference to FIGS. 2(*a*) and 2(*b*) having the output signal 91 used to short out one or more of the series resistors R in the voltage divider network having the adjustable reference voltage tap 385. Shorting out one or more resistors R above the tap 385 in the network will increase the reference voltage. As further shown in FIG. 7(*c*), another technique utilizes the novel fuse device 50 which normally operates to short one or more resistors in the adjustable voltage reference network 380 of FIG. 7(*c*). In this embodiment, the fuse 50 may be opened to increase the resistance R below the tap 385. This technique requires three voltage sources: a first source V1 connects the novel fuse structure 50 to ground (gnd); a voltage V3 which provides a fusing voltage to open the fuse "F"; and a voltage V2 which gates that fusing voltage to the fuse. After fusing, all voltages are kept at ground.

Figure 8A:
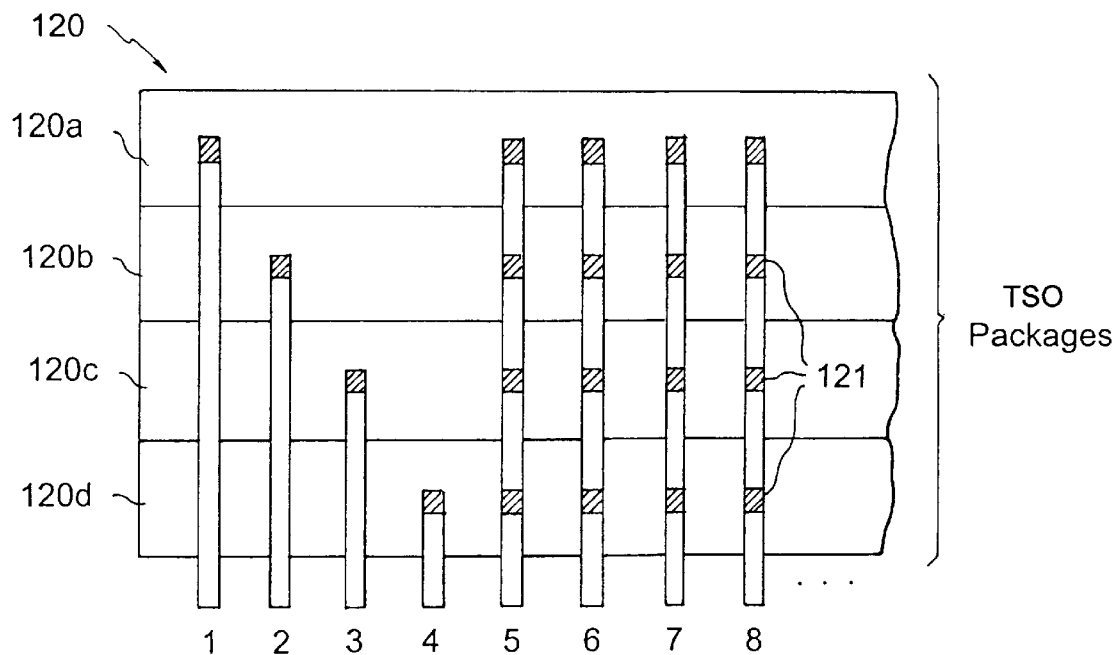
FIG. 8(*a*) illustrates a four (4) high stack module 120 comprising four TSO plastic encapsulated DRAMs.
Figure 8B:
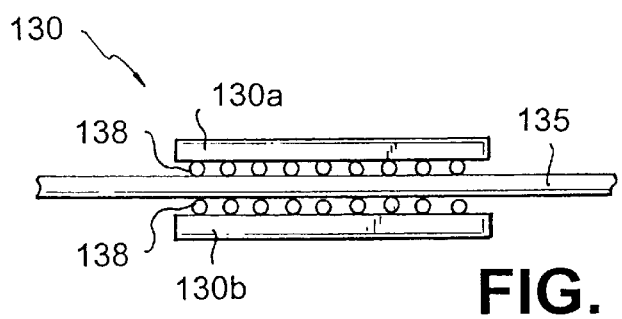
Figure 8C:
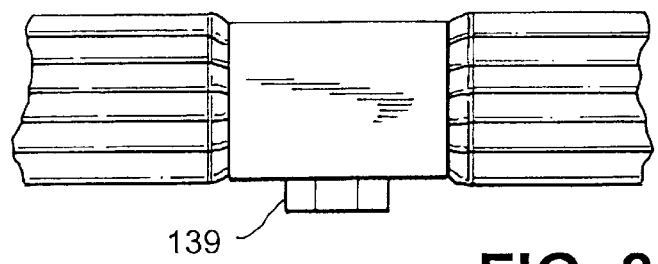

Referring now to FIG. 8(*a*), there is shown a four (4) high stack module 120 comprising four TSO plastic encapsulated DRAMs, for example, 4 Mb–16 Mb DRAMs or 4 Mb–64 Mb DRAMs, that each implements fuse blow circuitry, such as shown in FIG. 2(*a*) or FIG. 2(*b*). As depicted in FIG. 8(*a*), pins 1–4 are individual module selection pins, e.g., row address select (RAS) inputs, that are not shared. In the stack of four high chips (DRAM modules), one unique pin, i.e., pin 1, pin 2, pin 3, pin 4, is provided for contacting a respective module 120a, 120b, 120c, 120d at contacts indicated by shaded region in FIG. 8(*a*). Since each of pins 1–4 are unique, and if no buffer or buffer logic chip is implemented at any of these input pins 1–4, then a protective device associated with each pin for each module is retained, i.e., the fuse at each pin is not blown. However, if there is a buffer or buffer logic chip implemented at each pin, for example, in some DIM package applications, or, if a particular protective device eventually ends up buffered, the protective device at each pin may be disconnected in its respective chip. Thus, being that pin 4 has the shortest distance, the inductance between the pin and the input device is approximately 10 nh and the input capacitance is approximately 1.75 pf which assumes a PD and receiver. If the memory card contains an input buffer, then the protective device is disconnected by opening the fuse and the input capacitance is reduced to about 0.25 pf, for example. Pin 1, on the other hand, includes the inductance of the longer lead plus the inductance of the top chip 120a. The total input inductance is approximately 20 nh. The input capacitance is approximately 1.75 pf with the protective device and about 0.25 pf without a protective device on the top chip (ignoring the capacitance of the extra lead length).

Similarly, as shown in FIG. 8(*a*), pins labeled 5, 6, 7, 8, are in parallel, with each pin having four contacts for contacting a respective module 120a, 120b, 120c, 120d in the stack 120 as indicated by shaded regions 121 in FIG. 8(*a*). If these pins are not buffered, for each pin, three protective devices out of four are blown, i.e., the protective device is retained in one module of the stack. On the other hand, if it is a buffered module, i.e., if the pin leads 5–8 are buffered by some piece of logic between that and the outside world, all four of the protective devices associated with each module in the stack may be blown. For example, as Pin 5 is assumed to be an input pin connected to all 4 chips in the stack, its inductance is approximately 20 nh. The capacitance for the four chips in parallel is 7.0 pf. If there is no input buffer included in the memory stack or in the memory assembly, then one of the protective devices must remain connected; three (3) may be disconnected using fuse blow. The input capacitance is about 2.5 pf with one protective device in the stack. If a logic buffer is used with the stack, then all protective devices may be disconnected and the input capacitance is reduced to about 1.0 pf. Finally, if pin 6 is an input/output connection to 4 module pads in parallel, the input inductance is the same as for the input pads (20 nh). The capacitive load is about 19 pf for large OCD and PD connected. If the input/output pad is buffered, and fuses for the protective device and the OCD (not shown) are opened, then only the small OCD and receiver remain connected. The capacitance is thus reduced to 3.0 pf, an 84% reduction.

Similar to the principles described with respect to the TSO plastic encapsulated stack 120 described with respect to FIG. 8(*a*), FIGS. 8(*b*) and 8(*c*) show a cross section and a top view, respectively, of a two chip stack 130 consisting of DRAM memory chips 130a, 130b bumped on a flex or teflon carrier 135. Each of the modules 130a, 130b are connected to each by very low inductance solder bumps 138. The inductance of the package is reduced to approximately 2 nh due to the shorter lead lengths. The capacitance loading for two chips in parallel for an input connection is approximately 3.5 pf with protective devices in place, i.e., unbuffered. For those pins common to each module, i.e., shared, only one of the protective devices for each bump may be blown if unbuffered, reducing the input capacitance of about 2.0 pf, a 43% reduction. If the package is buffered, each of the two protective devices may be eliminated by blowing the fuse (respective device) elements and the input capacitance may be reduced to about 0.5 pf, an 85% reduction.

In the embodiment of FIGS. 8(*b*), 8(*c*), there is indicated a scan chain input 139 so that there is access to fusing using a scan method. However, the method described herein with respect to FIGS. 2(*a*), 2(*b*), 6(*a*) and 6(*b*), may also be implemented. In this instance, as shown in FIG. 6(*b*), there implemented a series of shift registers 136a, . . . ,136n one per pad (not shown) for receiving the scan chain input signal 139, with each shift register having a tap connecting a gate 81a, . . . ,81n, of respective associated transistor device 80a, . . . ,80n. That is, in response to a scan chain input 139, the output of every shift register 136a, . . . ,136n activates a respective transistor 80a, . . . ,80n to blow a respective fuse 50a, . . . ,50n. FIG. 6(*b*) may be applied at the wafer level to reduce the number of probe points required for wafer level test and burn-in.

U.S. Pat. No. 5,252,754 teaches through chip vias for chip to chip connections within a memory stack structure. If memory wiring is to be used within a stack of chips for fuse blow or for high speed interconnections, then the appropriate electrical characteristics are designed/fabricated for the interconnections. Stack interconnections for fuse blow are not as critical in terms of low capacitance and inductance requirements as those for high speed inputs and input/output lines.

FIG. 9(*a*) shows an alternate embodiment whereby memory chips 142, 144 are connected in a memory stack structure 140, in a manner such as described in U.S. Pat. No. 5,252,754, the contents and disclosure of which is incorporated by reference as if fully set forth herein. As described in U.S. Pat. No. 5,252,754, chip vias etched all the way through a chip and aligned to provide chip to chip connections. As shown in FIG. 9(*a*), respective trench connections 145, 147 are formed by etching at an angle, lining the trench via with an insulator 151, and filling it with a conductive plug 153 for connection to an active layer 155 including, for example, a fuse structure 50 as described herein. The bottom of each trench 145, 147 is directly connected by a solder interconnect bump 157, for example, to a conductive plug 154 of an active layer of a chip aligned thereunder, with the bottommost chip 144 being directly connected via trench connection and solder bump to an active layer of the buffer chip 146. According to the embodiment of FIG. 9(*a*), the trench aspect ratio is 20:1 and each the chip is approximately 250 um thick. That is, if the bottom of the trench conductor has a square shape of approximately 20 um per side (as is the shape of the bump), then the top of the conductor is a square approximately 32.5 um per side. It should be understood that this ratio may change depending upon the manufacturing process employed and the real estate of the wafer. The insulator 151 between conductor and the chip silicon substrate may range from ½ um (or less) to 10 um (or more). The overall trench opening may be adjusted accordingly. Using copper metallurgy, for example, with a resistivity of 1.7 micro ohm-cm, the resistance of the conductor will be approximately 4 milliohms. According to the embodiment of FIG. 8, the memory is now situated directly on the buffer chip 146 and thus, inductance is minimized.

Figure 9A:
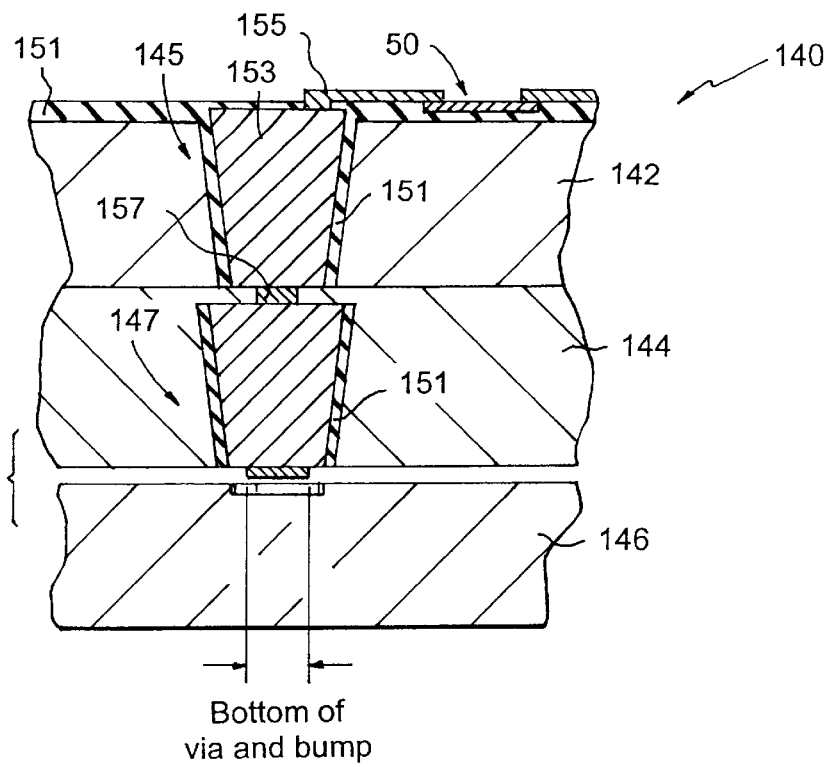
FIG. 9(*a*) illustrates an embodiment whereby semiconductor wafers may be connected in a memory stack structure using trench vias.
Figure 9B:
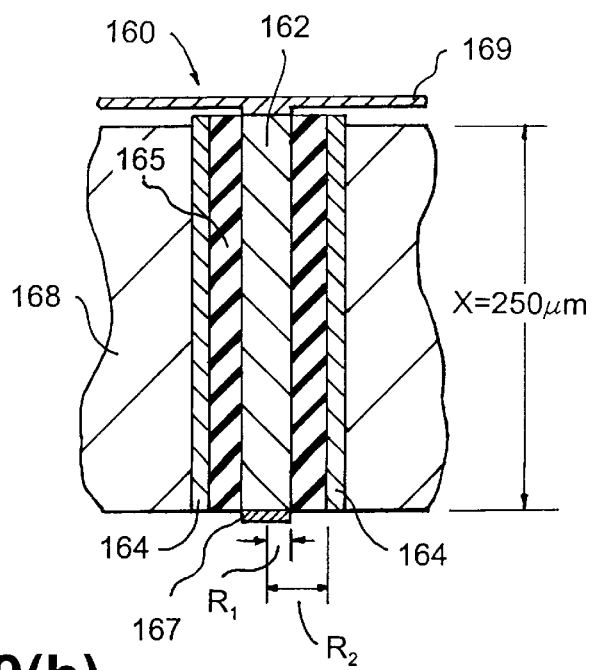

Another technique for forming a via hole through silicon chips is to use a laser such as described in commonly-assigned, U.S. Pat. No. 5,811,868, the contents and disclosure of which is wholly incorporated by reference as if fully set forth herein. In this example, a laser hole 160 of approximately 3.0 mils, or 75 micrometers, is drilled through wafers in the appropriate chip locations although smaller holes are possible. Such a hole may exceed 250 um in depth, with the wafer being over 600 micrometers thick. After backside grinding and a chem-mech-polish as needed, the hole will appear through the chips whose final thickness is approximately 250 um. Alternatively, the laser holes may be drilled after wafer grinding to 250 um of thickness. Preferably, each hole may be 75 microns in diameter. FIG. 9(b) illustrates a laser drilled hole 160 in a semiconductor chip with an inner conductor 162, e.g., Cu or Al, and which may connect to active circuitry or metal stop, e.g., a metal layer 169, an outer conductor 164 along the silicon walls that connect with the Si substrate 168 and an insulator 165 between the conductors. According to this embodiment, it may be possible to use only the center conductor 162, with the silicon semiconductor walls forming the second conductor, depending on the performance requirements of the interconnections. In another embodiment, the outer conductors may be at differing potentials than that of the silicon, for example, if insulator is provided between the outer conductor and the Silicon. Further shown in the laser via of FIG. 9(b) is the provision of an interconnect bump 167, e.g., a lead-tin combination, conductive paste, etc. which is used for contacting conductive layer of a chip aligned thereunder (not shown) in the manner such as shown in FIG. 9(a).

It should be understood that if high speed interconnections are to be fabricated in the silicon, then the electrical characteristics are designed to support high performance operation. It is necessary to know the values of inductance and capacitance for the interconnections, and to know if these interconnections behave as lumped capacitances and inductances, or as transmission lines. The electrical behavior is determined by the round trip delay time in relation to the rise time of the waveform. If the rise (or fall) time, Trt, of the waveform is greater than two times the round trip transmission time delay, Td, i.e., Trt>2 Td, lumped capacitance and inductance assumptions may be used such as described in the reference "Cross Talk and Reflections in High Speed Digital Systems", by A. Feller, H, Kaupp, J. Digiacomo, RCA, Proceedings—Fall Joint Computer Conference, 1965.

For the example silicon connection in FIG. 9(b), the inner conductor radius is R1=21.21 μm and an outer conductor radius is R2=31.25 μm, with an insulator (SiO2, for example) of 10 μm. The inductance for a line segment length of X (e.g., X=250 μm) is given by the equation: L=(uX/2π) ln(R2/R1), which, for the dimensions given above, results in an inductance L=0.019 nh. The bump 167 shown in FIG. 9(b) adds to the series inductance. However, the bump 167 is shallow, on the order of tens of micrometers, and can be expected to add up to 20% to the value of the inductance for each segment. The inductance per chip segment, including the bump connection, is estimated as L=0.023 nh for each 250 um line segment. The capacitance value for the segment is given by the equation: C=(ErEo/Tox)(2πR1)X, which, for the dimensions given above, results in a capacitance C=0.17 pf. Similarly, the resistance of the conductor may be calculated as R=(Rho)(X/Area); R=1.4 milliohms.

In sum, the electrical characteristics for the 250 um segments is L<0.1 nh, C<0.2 pf. The delay through the 250 um segments is less than 1 picosecond. The round trip delay Trd through one 250 um segment is less than 2 picoseconds (psec). For a stack of chips 8 high, the round trip delay Trd is <16 ps, and for a stack as high as 20 chips, the round trip delay is less than (<) 40 psec. The inductance and capacitance of 20 segments may be treated as lumped elements up to a frequency of 4 Ghz. Above 4 Ghz, the segments would behave as transmission lines requiring terminations. Connections inside the silicon are capable of very high frequency characteristics without cross talk and without radiation because the conductors are contained within the semiconductor material. The inductance for a 20 high stack is <2 nh, <0.8 nh for an 8 high chip stack, and <0.4 nh for a 4 high chip stack.

Figure 10:
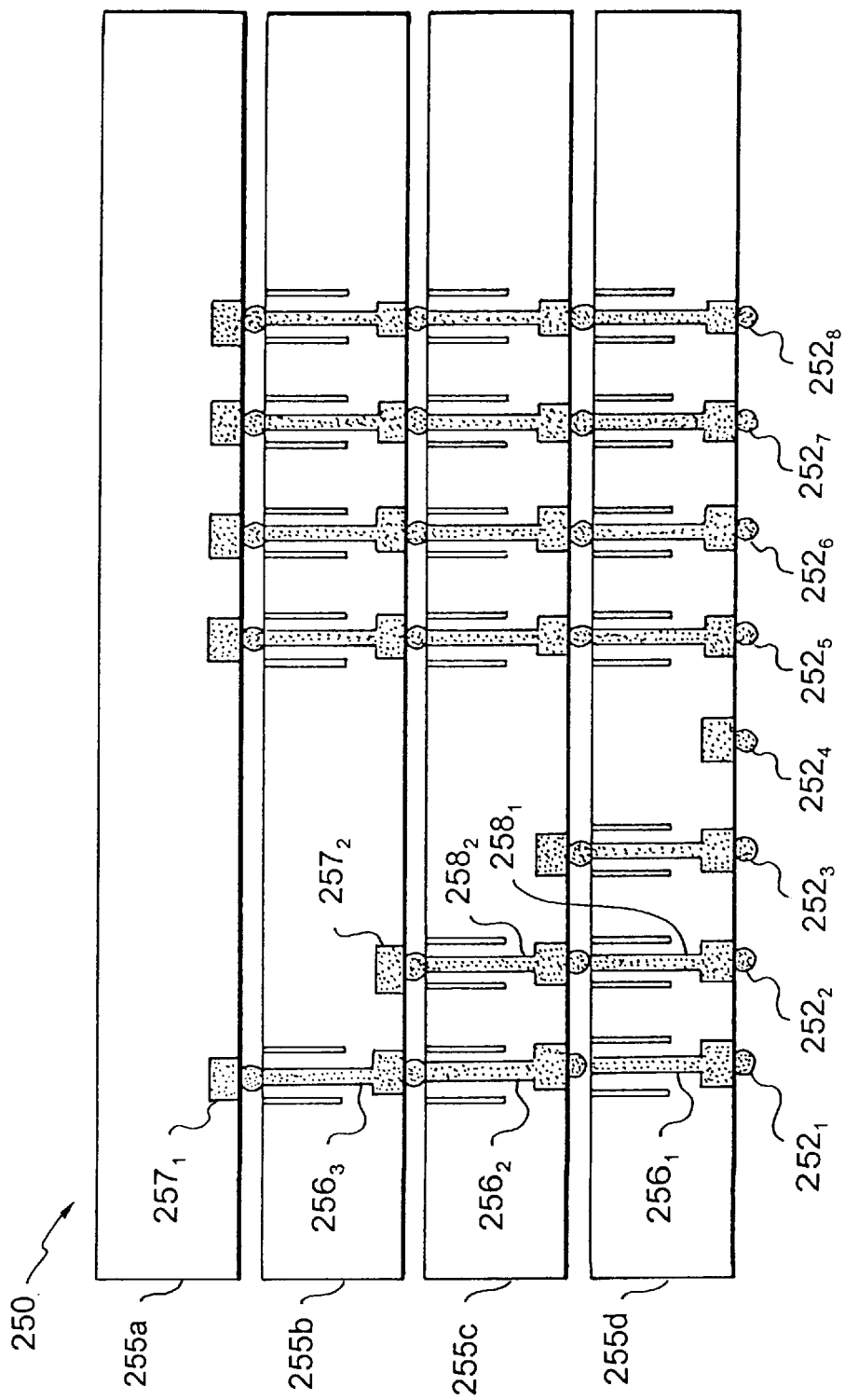
FIG. 10 illustrates a four (4) high stack of DRAM memory chips according to one aspect of the invention.

FIG. 10 illustrates a four (4) high stack of DRAM memory chips 250 according to the description herein provided with respect to FIG. 5. Preferably, the four (4) high stack of chips 250 is provided with the high speed chip to chip connections through the silicon as described herein with respect to FIGS. 8 and 9. The stack 250 is to be connected to a logic or μprocessor (or CPU) chip (not shown) which acts as a buffer. The receiver has a low capacitance of about 0.25 pf each and the protective devices at each pad contribute 1.5 pf which are to be disconnected by blowing fuses. As shown in FIG. 10, the chips 255a, . . . ,255d are mounted with the active area facing down (on the bottom) with each chip being configured for this position in the stack. Chip 255a does not have any via holes because it is the top chip of the stack 250. Connection $252_1$ (of chip 255d) connects to the receiver pad $257_1$ of chip 255a and requires three (3) interconnect via segments $256_1, \ldots ,256_3$ on respective chips 255b, . . . ,255d for connection therewith. Likewise, connection $252_2$ connects to the active circuitry (e.g., receiver) pad $257_2$ of chip 255b and requires two (2) interconnect via segments $258_1, \ldots ,258_2$ on respective chips 255d, 255c to reach it. It is understood that the via segments $256_1, \ldots ,256_3$ connecting pad $252_1$ to active circuits at pad $257_1$ of chip 255d do not include active circuitry but function as conducting conduits only. In the embodiment shown, this four chip stack configuration may provide a total capacitive load at connecting pad $252_1$ of about 2.35 pf with PD connected, and about 0.85 pf without protective device. Connection $252_4$ at the bottom chip 255d of the stack connects to a low capacitance receiver and has a capacitive load of about 1.75 pf with protective device and about 0.25 pf with protective device disconnected.

As further illustrated in FIG. 10, each of parallel connections $252_5$–$252_8$ connects to active regions (pads) on each chip of the stack through interconnecting via segments. Thus, for example, with each connection $252_5$–$252_8$ connected to a receiver at each chip of the stack via interconnecting segments, the total capacitive loading at a pads $252_5$–$252_8$ at chip 255d will be, for example, about 7.6 pf with all protective devices connected and about 1.6 pf with protective devices disconnected. If, for example, a connection $252_5$ is for a low drive OCD to a logic buffer, then the total capacitance for four (4) parallel input/output parallel connections with OCD, receiver, and protective device may be, for example, about 9.6 pf, including about 0.6 pf for the through chip connections. If the protective devices are disconnected, the capacitance is reduced to about 3.6 pf, including 0.6 pf for interconnect capacitance. Capacitive load and power dissipation are accordingly reduced by 62.5%.

Figure 11:
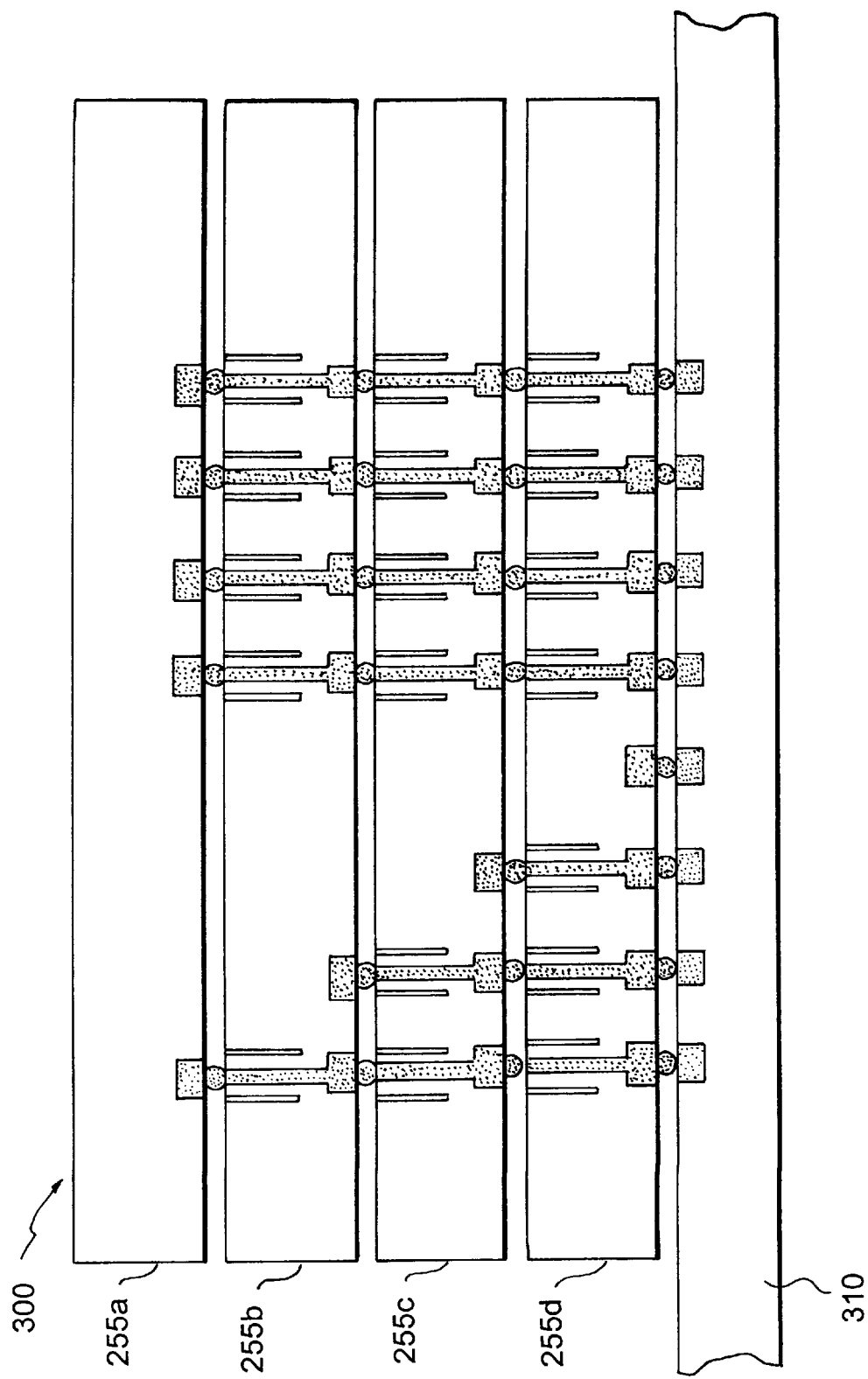
FIG. 11 illustrates the memory stack of chips mounted directly on a microprocessor (or other logic chip, e.g., memory controller) to minimize latency between the logic and memory

FIG. 11 illustrates the memory stack of chips 300 mounted directly on a microprocessor 310 (or other logic chip, e.g., memory controller) to minimize latency between the logic and memory and to maximize bandwidth. This configuration assumes that the logic chip or processor 310 has through connections only on one side. The logic chip or processor 310 may issue a command control signal to each chip in the stack (chip 1, 2, 3 or 4) and blow fuses to disconnect protective devices as described herein with respect to FIGS. 2(a) and 2(b).

Figure 12:
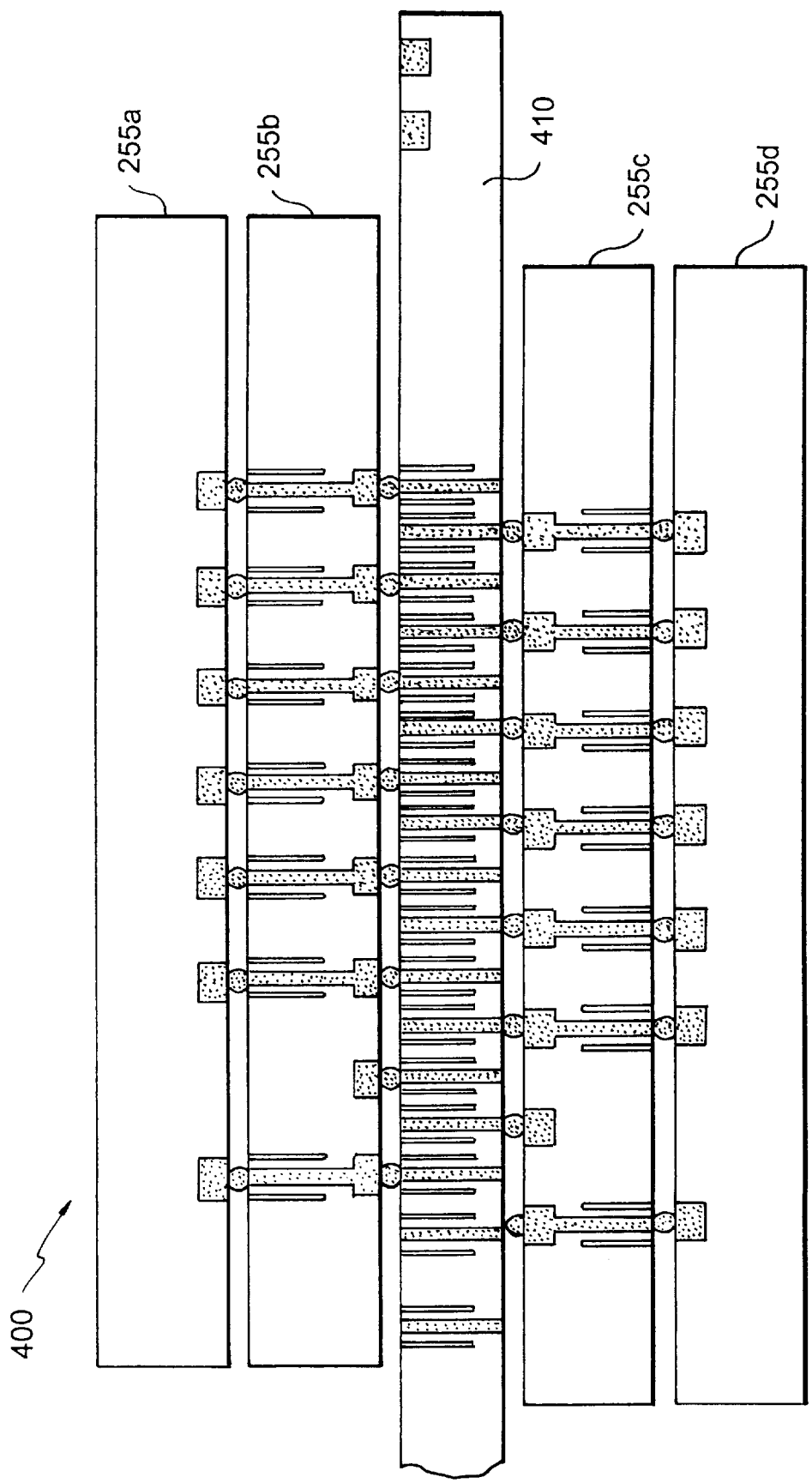
FIG. 12 illustrates the logic chip stack having through chip connections, such that the stack may be mounted with two chips on each side of a microprocessor(or other logic chip) for higher performance.

FIG. 12 illustrates the logic chip stack 400 having through chip connections, such that the stack may be mounted with two chips on each side of the μprocessor 410 (or other logic chip) for even higher performance. This configuration assumes that the logic chip or processor 410 has through connections for connecting memory chips on both sides.

FIGS. 10–12 depicts the use of chips uniquely customized for a position in the stack structure, thus, requiring an inventory of many different part numbers. One chip, the top chip, may use a standard chip with the same pads as those in a single chip package, with the chips on other levels are unique. Additionally, some connections are made to only one chip, while others are made to all chips in the stack. As now described with further view of FIGS. 13–17, only one connection is made to each of the chips in the stack and this embodiment is now referred to herein as a point to point connection. In the four high chip stack example embodiments depicted in FIGS. 13–16, an approach is presented enabling single point connections between chips thereby minimizing loading at each stack connection and maximizing chip performance. As will be described, this approach requires more connections in the stack structures, however, as shown in FIGS. 13–16, stacks may be built using identical chips that are connected and shifted to allow through connections, with point-to-point connections within the stack.

Figure 13:
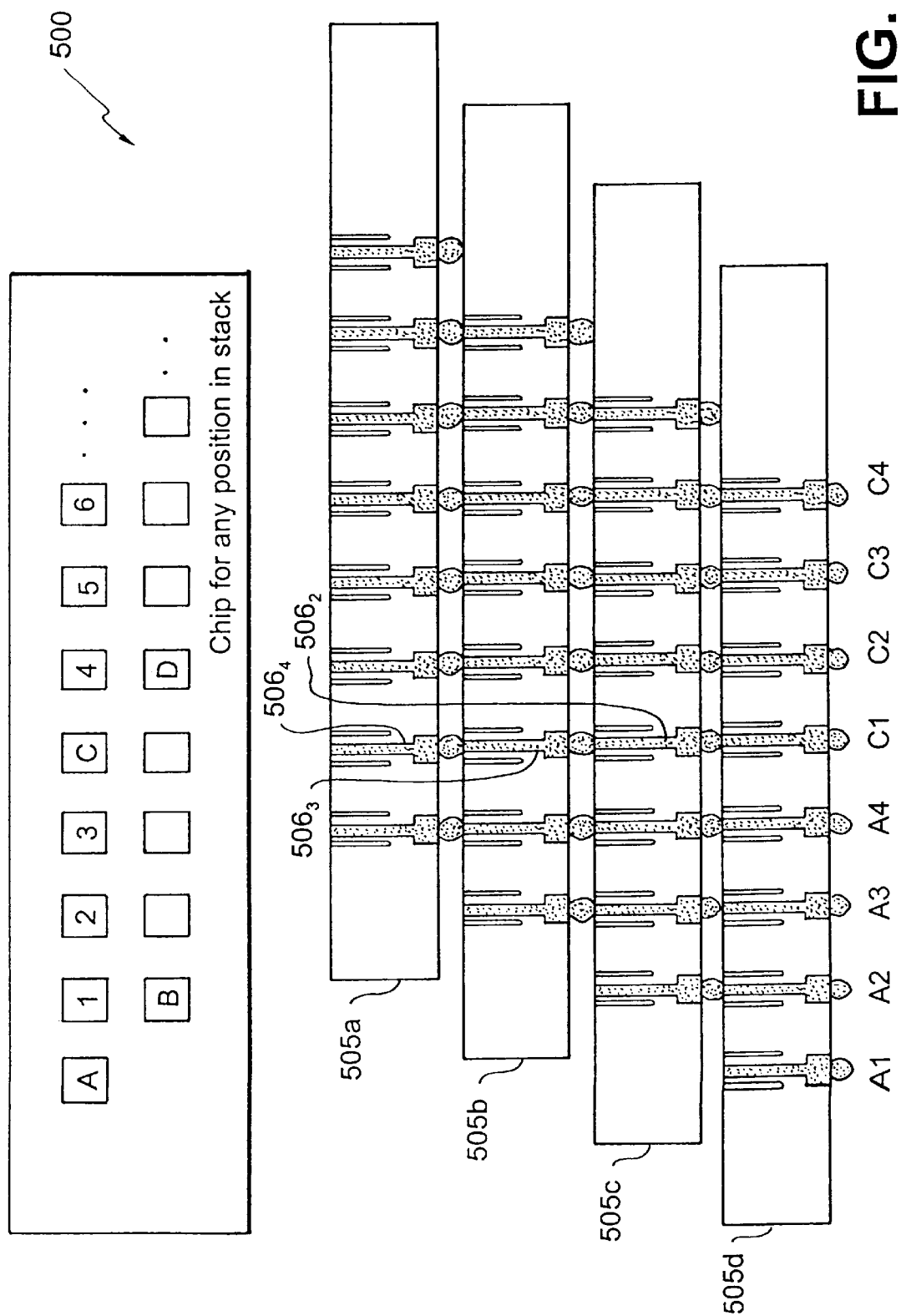
FIGS. 13–16 each illustrate a chip stacking approach for enabling single point connections between chips to minimize loading at each stack connection and maximize chip performance.

FIG. 13 illustrates a top view of a chip stack structure 500 having four (4) pads labelled A–D. In addition, 3 extra pad connections are provided next to each pad. Pads A–D are connected to active circuitry on the chip and to a through chip via hole. The extra pad connections 1, 2, 3, 4, etc. are via holes only and do not connect to active circuitry. The chips are designed such that a lateral translation of one position for each stack layer produces a point to point connection to the stack connection points. Pad to pad spacings are, for example, approximately 150 um, so a translation (shift) of 150 um is required for each stack layer. As chips are typically 15 mm long, a translation of approximately 0.1 mm to 0.2 mm is very small by comparison. It is understood that FIG. 13 illustration is not to scale, and the overhang of adjacent chips is greatly exaggerated in the drawings. As shown in FIG. 13, a first chip pad A for chip 505*a* is connected at A1, and the pad A for fourth chip 505*d* is connected to pad A4, of chip 505*d*. Likewise, chip 505*b* is connected at pad A3 and chip 505*c* is connected at pad A2, etc. If pad A is a receiver, then, with protective diode disconnected, e.g., by the fuse blow method described herein, then connection A1 has a capacitive load of about 0.25 pf. Connection A4 has a capacitive load of about 1.05 pf. It is understood that, in this embodiment, there may be unnecessary loading at pads, e.g., pad C1, as this pad is only needed for connection to chip 505*d*, yet carries via interconnect segments 506$_2$, . . . ,506$_4$ that do not connect to active circuits.

Figure 14:
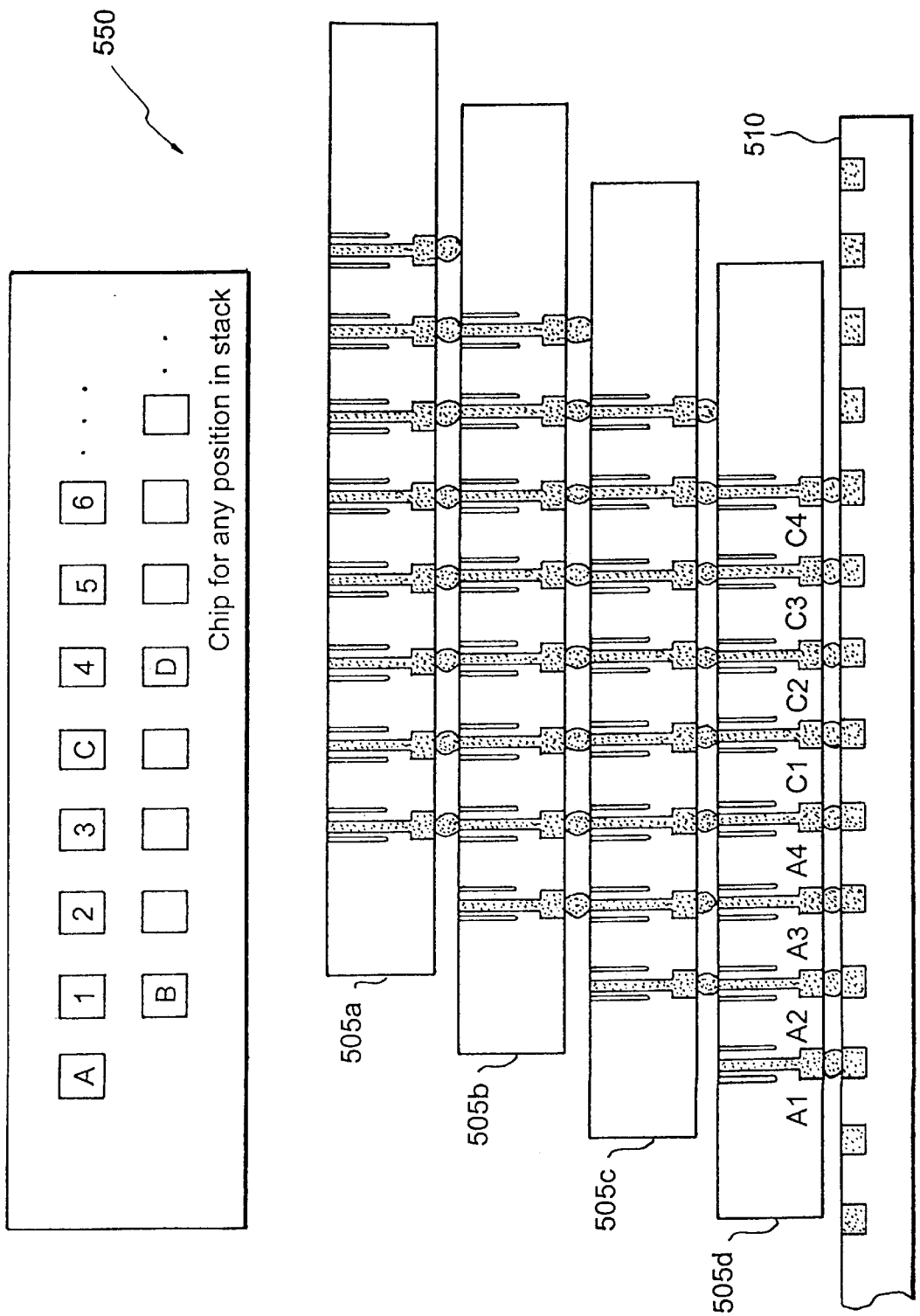
Figure 15:
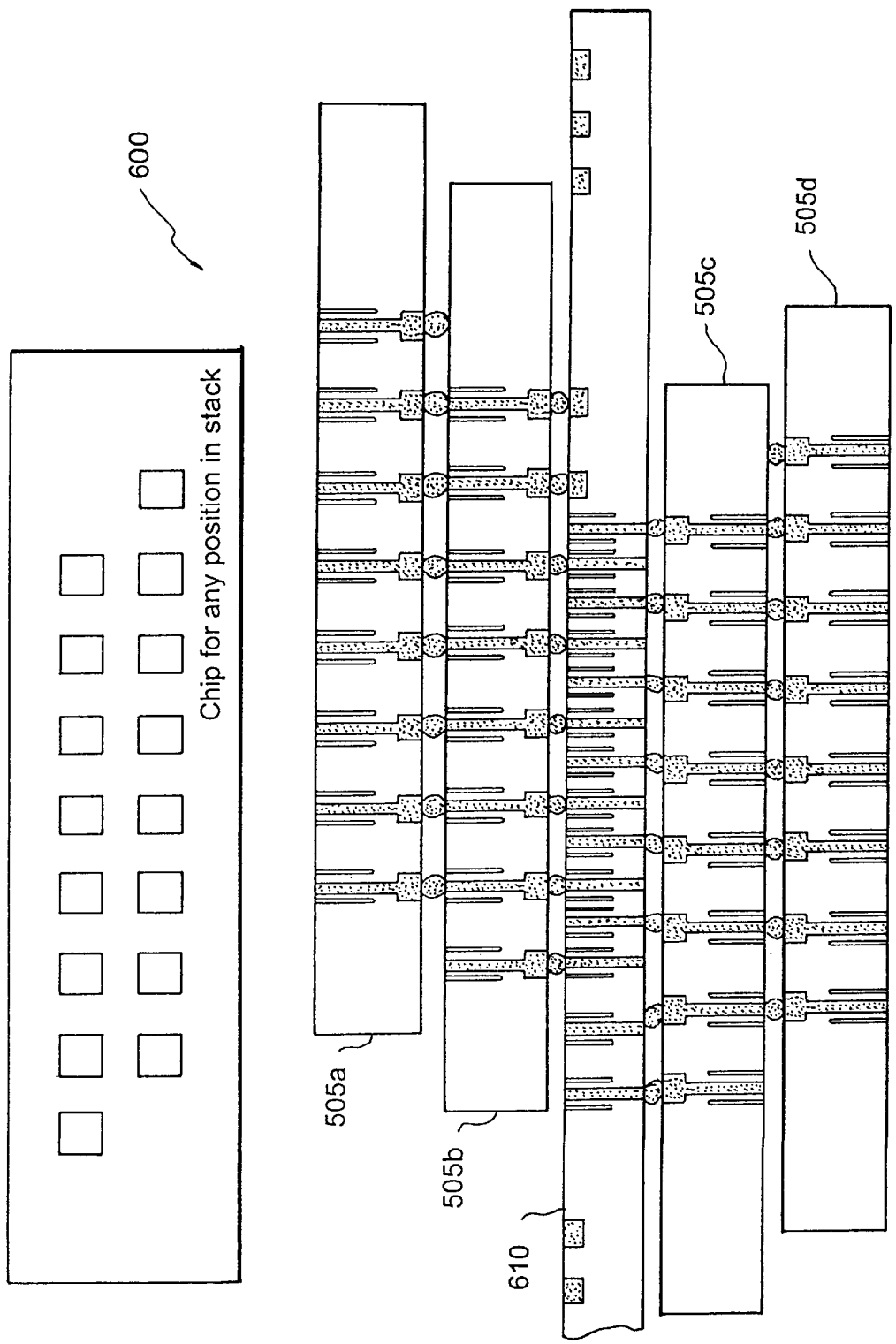
Figure 16:
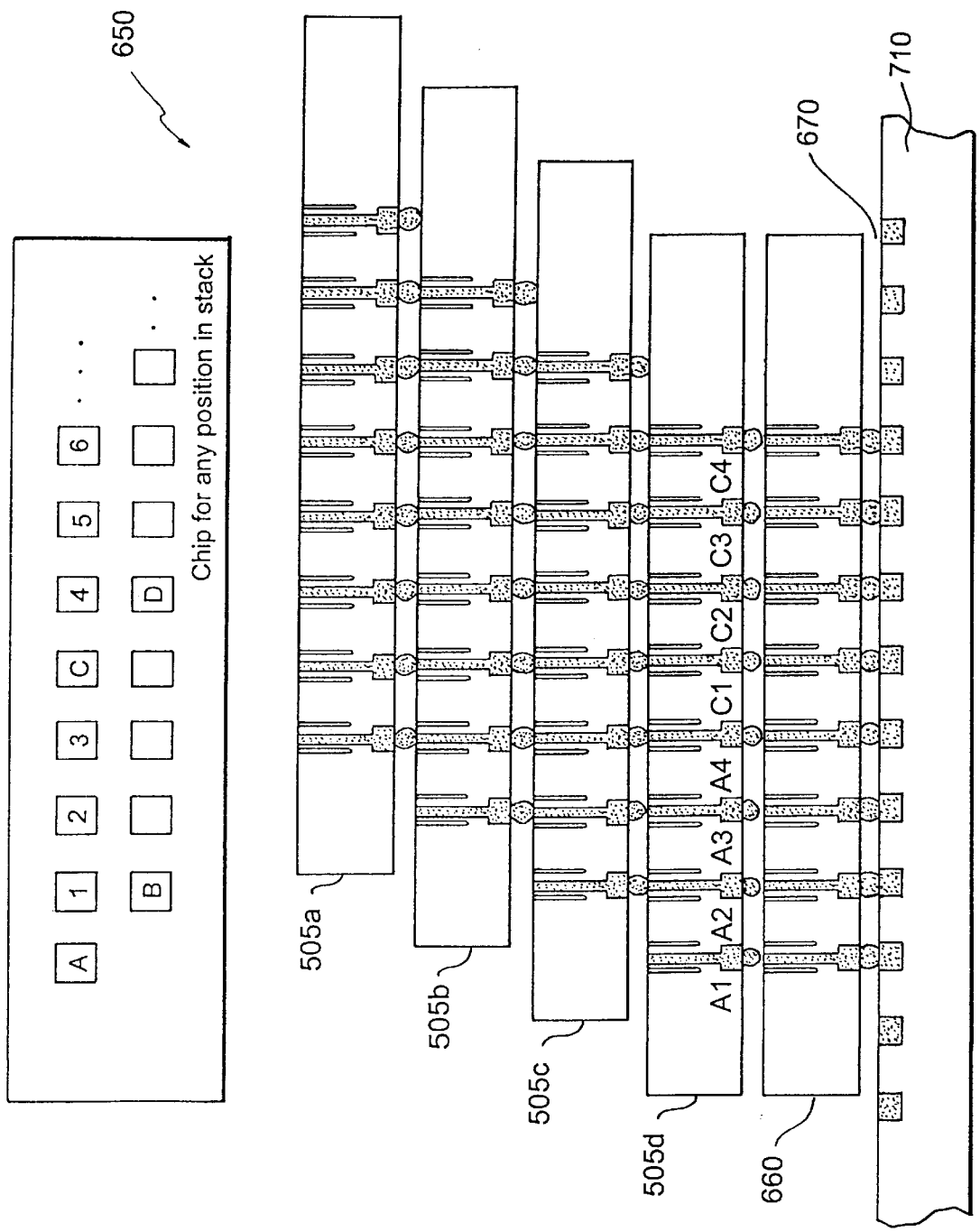

FIG. 14 illustrates the stack 550 mounted directly on a microprocessor (or logic chip) 510 for minimum latency and maximum bandwidth. As shown in FIG. 14, the microprocessor chip 510 has topside connections. If the processor 510 is placed in the middle of the stack 600 as in FIG. 15, the loading of the interconnections is further reduced. The configuration of FIG. 15 assumes that the microprocessor chip 610 has through connections on both sides of the chip. It should be understood that the logic or microprocessor chips 510 (FIG. 14) and 610 (FIG. 15) may be built in a higher performance technology than that of the memory chips 505*a*, . . . ,505*d* in order to gain the maximum performance benefit. FIG. 16 illustrates the stack 650 (of FIG. 14) however mounted on a high performance chip, e.g., memory controller chip 660, which provides through connections 670 at the bottom to enable optional additional stacking on a microprocessor chip 710.

It is known that a dynamic RAM process makes tradeoffs in the direction of costs, i.e., dynamic RAM's must be low cost at the sacrifice of raw performance. Thus, DRAM technology is simply not as aggressive as technology implementing logic or faster static RAMs (SRAM) applications which are of a completely different faster technology. Consequently, SRAM devices do not normally communicate with DRAM, i.e., they cannot share an address. However, implementing the stacked chip technology described herein, it is possible to marry SRAM technology with DRAM technology while each function remains on its own separate optimized chip.

Figure 17:
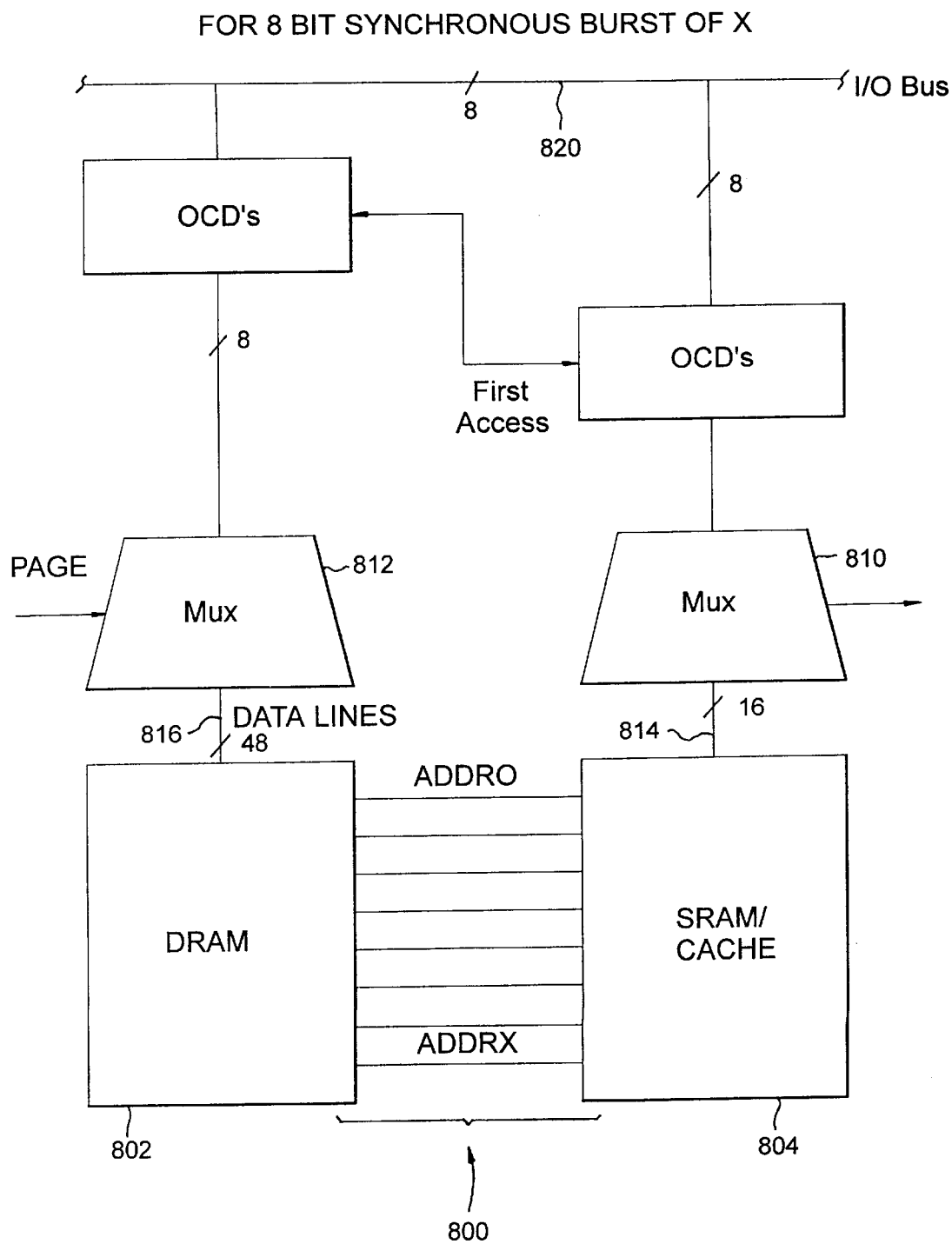
FIG. 17 illustrates an equivalent circuit comprising DRAM and SRAM cache memory chips that are directly connected together in a stacked structure and sharing address lines for use in high-speed memory access applications.

As an example, given a stack of one or more DRAM chips, an SRAM chip may be directly connected in the stack forming direct address connections between the chips. An equivalent circuit diagram is shown in FIG. 17 which illustrates a DRAM 802 and SRAM cache 804 connected together in a stack structure 800 and sharing address lines addr0, . . . ,addrx with address signals provided to each chip by a memory controller (not shown). There is further provided a multiplexer device 810 corresponding to SRAM cache 804 for outputting information along data lines 814, and a MUX 812 corresponding to DRAM memory 802 for outputting data information along lines 816. In operation, as the data access time in the static RAM 804 is very fast, 16 bits of data corresponding to the first address lines will first be immediately accessed first at line 814 from the SRAM device in order to reduce latency. As soon as the information is accessed from SRAM, that information is dumped through OCD's. As shown in the example circuit of FIG. 17, the mux performs a 2:1 multiplex so eight bits will be output at a time. At the same time as the SRAM is activated to the same address, the DRAM device 802 is activated. The DRAM is much slower, however, may output a lot more information, e.g., forty-eight (48) more bits in 6-byte increments may be output from the DRAM at line 816. Given an eight bit I/O bus 820, sixteen bits are pulled out of the SRAM immediately, for feeding at eight bits at a time. By the time the SRAM has finished outputting its sixteen bits, the DRAM is going to output the next set of bits, e.g., 48 bits in 8 bit increments. That is, latency has been reduced because the time to get those first sixteen bits out requires no DRAM wait time because of the presence of the SRAM directly coupled thereto which provides the first sixteen bits.

Thus, given an SRAM access time of 5 nanoseconds, i.e., 16 bits are output in 5 nsec, with a buffered output so that first 5 ns outputs first 8 bits and the next 5 ns outputs the next 8 bits. By the time the SRAM has finished processing, the DRAM is ready to output the next 48 bits, as shown at the output line 816, assuming a DRAM cycle access time of 15 ns. Thus, an 8-bit stream may be output of the buffered SRAM and DRAM chips with the first 16 bits output in the first 15 nsec by the SRAM due to the 2:1 multiplex. The next 48 bits, for example, are output in succeeding 8-bit increments from the DRAM. Thus, in effect, the memory stack 800 comprising directly coupled SRAM and DRAM memory chips may appear as a 5 ns access time memory with a page depth of 8 bytes and a data rate per pin of 5 ns. The memory stack as designed has a 100% cache hit ratio, with the data shared between the SRAM and DRAM, on separate chips, as described.

It should be understood that the DRAM memory might be eight times larger (8:1) than the SRAM. Therefore, in effect, if there is provided a 64 MB DRAM, an 8 Mg SRAM which is three (3×) as fast as the DRAM, may be implemented in this example structure. However, it should be understood that there are many optimum ways to provide this stack structure; for example, a DRAM chip, an SRAM chip, and then a DRAM chip may be implemented with many different speeds and memory densities, in order to minimize latency—in terms of communication, as there is communication back and forth, directly between the chips. Thus, given an address command in the logic module, the controller selects an address, it gives the same address to the DRAM and the SRAM, the SRAM turns around in 5 nanoseconds, by example, the DRAM turns around in 15.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims. For example, while the chip stacking has been described herein in terms of DRAM memories, these concepts apply to SRAMs, Flash, EEPROM and even logic chips.

Having thus described our invention, what we claim as new, and desire to secure the letters patent is:

1. A method for reducing impedance loading of semiconductor integrated circuit devices implementing protective device structures that contribute to impedance loading at an I/O pad connection, said method comprising:

providing a fuse device between said I/O pad connection and said protective device;

connecting a current source device associated with each fuse device in said integrated circuit, said current source device connected to one end of said fuse device;

providing fuse selection circuit for activating current flow through a selected fuse device between said current source and said I/O connection, said current flow being of an amount sufficient for blowing said fuse and disconnecting said protective device from said circuit structure, thereby reducing impedance loading at said I/O connection.

2. The method as claimed in claim 1, wherein said current source device comprises MOS transistor device having a first terminal connected to a power supply line, a second terminal connected to said one end of said fuse device, and a third gate control terminal responsive to said fuse selection circuit for activating current flow from said power supply line through said fuse device.

3. The method as claimed in claim 1, wherein said fuse device comprises an interlevel conducting element partially exposed in an air gap separating said interlevel conducting element from an underlying substrate.

4. The method as claimed in claim 2, wherein said fuse selection circuit comprises logic for generating an activation signal selecting a fuse device to be blown, said gate control terminal responsive to said activation signal for enabling said current flow.

5. The method as claimed in claim 4, wherein said fuse selection circuit includes generating successive activation signals for blowing plurality of fuse devices.

6. The method as claimed in claim 5, wherein each said current source device includes shift register having tap connected to said gate control terminal of a respective said transistor device, said fuse selection device further generating a scan line signal for receipt by each said register to enable successive blowing of said fuse devices associated with I/O connections.

7. A stacked structure chip structure comprising one or more semiconductor integrated circuit chips in a stacked relation, each said chip comprising:

a layer of active circuitry formed at a first layer of each said chip;

plurality of through conducting means disposed substantially vertically through each said chip for enabling electronic connection with said active circuitry of said first layer;

second conducting means disposed at an end of said through conducting means at an opposite side of a chip for connection with a corresponding through conductive means of an adjacent stacked chip, said stacked chip structure formed by aligning one or more through conducting means and second conducting means of adjacent chips in said stacked relation, whereby a chip of said stack is electronically connected to active circuitry formed on other chips of said stack.

8. The stacked chip structure as claimed in claim 7, wherein said active circuitry includes a protective device connecting said active circuitry through a fuse device, said structure including means for blowing said fuse device.

9. The stacked chip structure as claimed in claim 7, wherein said second conducting means comprises a solder bump.

10. The stacked chip structure as claimed in claim 7, wherein said stacked chip structure includes stacks of DRAM chips.

11. The stacked chip structure as claimed in claim 7, wherein a chip maintains through conducting mean s at specific locations for enabling through connections to other chips in the stack, a said chip having a unique position in said stacked structure.

12. The stacked chip structure as claimed in claim 11, wherein a chip maintains connections to all chips in said stacked structure.

13. The stacked chip structure as claimed in claim 7, wherein said through conducting means is provided at locations for connection to each of said chips in said stack structure.

14. The stacked chip structure as claimed in claim 13, wherein each chip in said stack maintains first through conductors at locations identical to every other chip in said stack, each chip designed such that a lateral translation of one position for each stack layer produces a point-to-point connection to stack connection points.

15. The stacked chip structure as claimed in claim 7, wherein said stacked structure is directly mounted to a microprocessor device.

16. The stacked chip structure as claimed in claim 7, wherein said stacked structure is directly mounted to a memory controller device.

17. The stacked chip structure as claimed in claim 7, wherein said stacked structure includes a DRAM device directly connected with an SRAM device.

18. The stacked chip structure as claimed in claim 7, wherein a first stacked structure is directly connected to a first side of a logic device and a second stacked structure is directly connected to a second side of said logic device.

19. A system for reducing impedance loading of semiconductor integrated circuit devices implementing protective device structures connected to an I/O pad connection for protecting an associated active circuit structure connected therewith and contributing to an impedance load at said I/O pad connection, said system comprising:

a fuse device connected at a first end between an I/O pad connection and said protective device structure;

a current source device associated with each fuse device in said integrated circuit and connected to one end of said fuse device;

a fuse selection circuit for activating current flow through a selected fuse device from between said current source and said I/O connection, said current flow being of an amount sufficient for blowing said fuse and disconnecting said protective device from said circuit structure, thereby reducing impedance loading at said I/O connection.

20. The system as claimed in claim 19, wherein said current source device comprises MOS transistor device having a first terminal connected to a power supply line, a second terminal connected to said one end of said fuse device, and a third gate control terminal responsive to said fuse selection circuit for activating current flow from said power supply line through said fuse device.

21. The system as claimed in claim 20, wherein said fuse device comprises an interlevel conducting element partially exposed in an air gap separating said interlevel conducting element from an underlying substrate.

22. The system as claimed in claim 20, wherein said fuse selection circuit comprises logic for generating an activation signal selecting a fuse device to be blown, said gate control terminal responsive to said activation signal for enabling said current flow.

23. The system as claimed in claim 22, wherein said fuse selection circuit includes generating successive activation signals for blowing plurality of fuse devices.

24. The system as claimed in claim 20, wherein each said current source device includes shift register having tap connected to said gate control terminal of a respective said transistor device, said fuse selection device further generating a scan line signal for receipt by each said register to enable successive blowing of said fuse devices associated with I/O connections.

25. The system as claimed in claim 19, implemented in one or more of semiconductor integrated circuit chips disposed in a stacked relation, wherein each said chip comprises:

a layer of active circuitry formed at a first layer of each said chip and having said fuse device;

plurality of through conducting means disposed substantially vertically through each said chip for enabling electronic connection with said active circuitry of said first layer;

second conducting means disposed at an end of said through conducting means at an opposite side of a chip for connection with a corresponding through conductive means of an aligned, adjacent stacked chip, said means for blowing said fuse device communicating signals via said through conducting means for initiating fuse blow at selected chips disposed in said stacked chips relation.

26. A system for reducing impedance loading of semiconductor integrated circuit devices implementing one or more off-chip driver (OCD) device structures connected to an I/O pad connection for driving associated active circuit devices connected therewith and contributing to an impedance load at said I/O pad connection, said system comprising:

a fuse device associated with at least one OCD device structure, said fuse device connected at a first end between an I/O pad connection and an OCD device structure;

means for activating current flow through a fuse device, said current flow being of an amount sufficient for blowing said fuse and disconnecting an OCD device from said circuit structure thereby reducing impedance loading at said I/O connection.

27. The system as claimed in claim 26, wherein said one or more OCD devices includes a first OCD device structure connected to an I/O pad for driving first circuit loads, said fuse device associated with said first OCD device, and a second OCD device structure connected to said I/O pad for driving a second circuit load, a first circuit load being greater than said second circuit load, whereby said fuse device associated with said first OCD device is blown when connected to circuits driving second circuit loads.

28. The system as claimed in claim 27, further including a fuse device associated with said second OCD device structure, wherein said fuse device associated with said second OCD device is optionally blown when connected to circuits driving first circuit loads.

29. The system as claimed in claim 27, wherein said means for activating current flow comprises:

a MOS transistor device having a first terminal connected to a power source, a second terminal connected to one end of a selected fuse device, and a third gate control terminal responsive to a signal for activating current flow from said power source through said fuse device.

30. The system as claimed in claim 27, wherein said OCD structure includes an amplifier output stage having PMOS and NMOS output transistors and defining N-well and P-well diode devices, said means for activating said current flow including power source means connected to said input pad, and means for forward biasing one of said diode devices, wherein said forward biased diode device conducts sufficient current from said power source to enable blowing of said fuse device.

31. The system as claimed in claim 27, wherein said fuse device comprises an interlevel conducting element partially exposed in an air gap separating said interlevel conducting element from an underlying substrate.

* * * * *